(12) United States Patent
Yudanov

(10) Patent No.: US 12,033,716 B2
(45) Date of Patent: Jul. 9, 2024

(54) INDUCTIVE ENERGY HARVESTING AND SIGNAL DEVELOPMENT FOR A MEMORY DEVICE

(71) Applicant: Micron Technology, Inc., Boise, ID (US)

(72) Inventor: Dmitri A. Yudanov, Rancho Cordova, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 18/084,914

(22) Filed: Dec. 20, 2022

(65) Prior Publication Data

US 2023/0197120 A1 Jun. 22, 2023

Related U.S. Application Data

(62) Division of application No. 16/941,107, filed on Jul. 28, 2020, now Pat. No. 11,557,325.

(51) Int. Cl.
*G11C 7/06* (2006.01)
*G11C 11/22* (2006.01)

(52) U.S. Cl.
CPC .............. *G11C 7/06* (2013.01); *G11C 11/221* (2013.01); *G11C 11/2259* (2013.01); *G11C 11/2273* (2013.01); *G11C 11/2275* (2013.01); *G11C 11/2297* (2013.01)

(58) Field of Classification Search
CPC ..... G11C 11/2273; G11C 5/14; G11C 11/221; G11C 7/06; G11C 11/2297; G11C 11/2259; G11C 11/2275; H02J 50/001; H02J 50/10
See application file for complete search history.

(56) References Cited

U.S. PATENT DOCUMENTS

| | | | |
|---|---|---|---|
| 3,195,114 A | 7/1965 | Gunderson et al. | |
| 7,042,789 B2* | 5/2006 | Bangert | G11C 11/1655 365/230.02 |
| 2005/0105368 A1 | 5/2005 | Bangert | |
| 2016/0232956 A1* | 8/2016 | Ishizu | G11C 8/12 |
| 2020/0072884 A1* | 3/2020 | Rowley | G11C 29/021 |
| 2022/0037920 A1 | 2/2022 | Yudanov | |

* cited by examiner

*Primary Examiner* — Tuan T Nguyen
(74) *Attorney, Agent, or Firm* — Holland & Hart LLP

(57) ABSTRACT

Methods, systems, and devices for inductive energy harvesting and signal development for a memory device are described. One or more inductors may be included in or coupled with a memory device and used to provide current for various operations of the memory device based on energy harvested by the inductors. An inductor may harvest energy based on current being routed through the inductor or based on being inductively coupled with a second inductor through which current is routed. After harvesting energy, an inductor may provide current, and the current provided by the inductor may be used to drive access lines or otherwise as part of executing one or more operations at the memory device. Such techniques may improve energy efficiency or improve the drive strength of signals for the memory device, among other benefits.

20 Claims, 13 Drawing Sheets

INDUCTIVE ENERGY HARVESTING AND SIGNAL DEVELOPMENT FOR A MEMORY DEVICE

CROSS REFERENCE

The present application for patent is a divisional of U.S. patent application Ser. No. 16/941,107 by Yudanov, entitled "INDUCTIVE ENERGY HARVESTING AND SIGNAL DEVELOPMENT FOR A MEMORY DEVICE," filed Jul. 28, 2020, assigned to the assignee hereof, and is expressly incorporated by reference in its entirety herein.

BACKGROUND

The following relates generally to one or more systems for memory and more specifically to inductive energy harvesting and signal development for a memory device.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random-access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), not-and (NAND), not-or (NOR), and others. Memory devices may be volatile or non-volatile. Non-volatile memory, e.g., FeRAM, may maintain their stored memory value for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device. Non-volatile memory cells (e.g., NAND memory cells) may maintain their programmed states for extended periods of time even in the absence of an external power source.

DETAILED DESCRIPTION

Inductors may harvest energy, for example based on a current routed through a circuit. An inductor may then act as a current source based on the harvested energy. For a memory device, inductors may be included in or coupled with the memory device and used to provide current for various operations of the memory device based on harvested energy. An inductor may harvest energy based on current being routed through the inductor or based on being inductively coupled with a second inductor through which current is routed. After harvesting energy, an inductor may provide current, and the current provided by the inductor may be used to drive access lines or otherwise as part of executing one or more operations at the memory device. This may provide benefits such as improving energy efficiency of the memory device or improving the drive strength of signals used to operate the memory device, among other benefits that may be appreciated by one of ordinary skill in the art.

Features of the disclosure are initially described in the context of systems and dies as described with reference to FIGS. 1-2. Features of the disclosure are described in the context of circuits as described with reference to FIGS. 3-6. These and other features of the disclosure are further illustrated by and described with reference to an apparatus diagram and flowcharts that relate to inductive energy harvesting and signal development for a memory device as described with reference to FIGS. 7-13.

Figure 1:
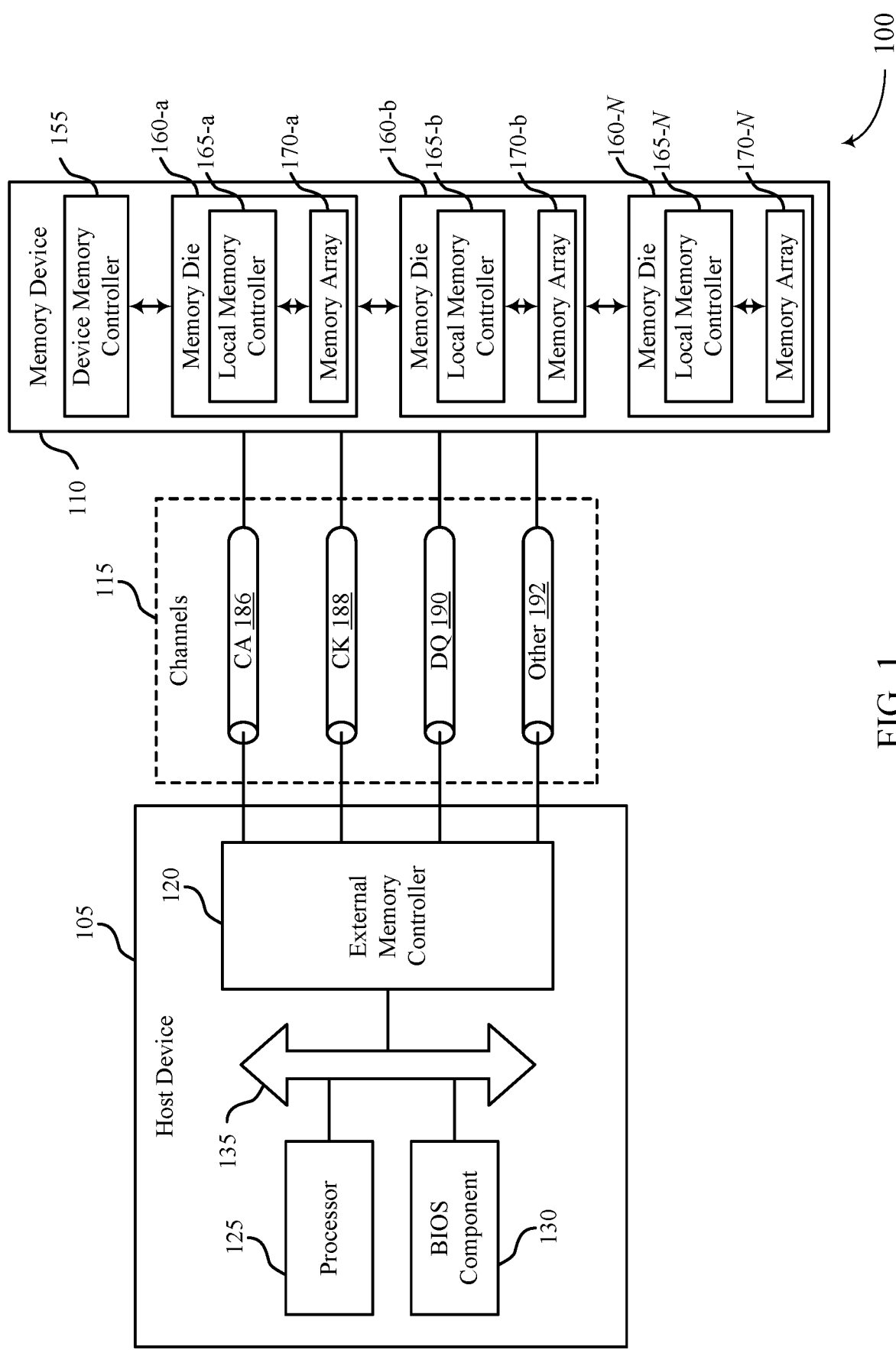
FIG. 1 illustrates an example of a system that supports inductive energy harvesting and signal development for a memory device in accordance with examples as disclosed herein.

FIG. 1 illustrates an example of a system 100 that supports inductive energy harvesting and signal development for a memory device in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110). The system 100 may illustrate one example type of memory in which the techniques and structures described herein may be utilized; however, the techniques and structures described herein may be implemented in any type of memory.

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of ROM, flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package. In some cases, multiple memory dies 160 may be stacked one upon another within a memory device 170 to form one or more die stacks. In some cases, a magnetic cache 175 and a memory array 170 may be in different memory dies 160 of the same memory stack.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channels 186 may carry a read command with an address of the desired data. In some examples, a CA channel 186 may include any number of signal paths to decode one or more of address or command data (e.g., eight or nine signal paths).

In some cases, the memory device 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities. The channels 115 may be configured to support communications between the host device 105 and the memory device 110 in accordance with an associated protocol (e.g., to exchange or otherwise communicate control, address, data, and other signals between the memory device 110 and the host device 105). Examples of possible protocols include, but are not limited to, a serial advanced technology attachment (SATA) interface, a UFS interface, an eMMC interface, a peripheral component interconnect express (PCIe) interface, a USB interface, Fiber Channel, Small Computer System Interface (SCSI), Serial Attached SCSI (SAS), DDR, a DIMM interface (e.g., DIMM socket interface that supports DDR), an Open NAND Flash Interface (ONFI), Low Power Double Data Rate (LPDDR), a Non-Volatile Memory Express (NVMe) protocol interface, a Non-Volatile Memory Host Controller Interface Specification (NVMHCIS), and the like.

In some examples, the memory device 110 may include one or more inductors coupled with one or more components of the memory device 110. The inductors may harvest energy, for example based on a current routed through a circuit of the memory device 110. An inductor may then act as a current source based on the harvested energy. For example, an inductor may be used to provide current for various operations of the memory device 110 based on harvested energy. An inductor may harvest energy based on current being routed through the inductor or based on being inductively coupled with a second inductor through which current is routed. As one example, after harvesting energy, an inductor may provide current, and the current provided by the inductor may be used to drive access lines or otherwise as part of executing one or more operations (e.g., read operations, write operations, etc.) for accessing a memory array 170 of the memory device 110. Such inductor-supported operations may provide benefits such as improving energy efficiency of the memory device 110 or improving the drive strength of signals used to operate the memory device 110, among other benefits.

Figure 2:
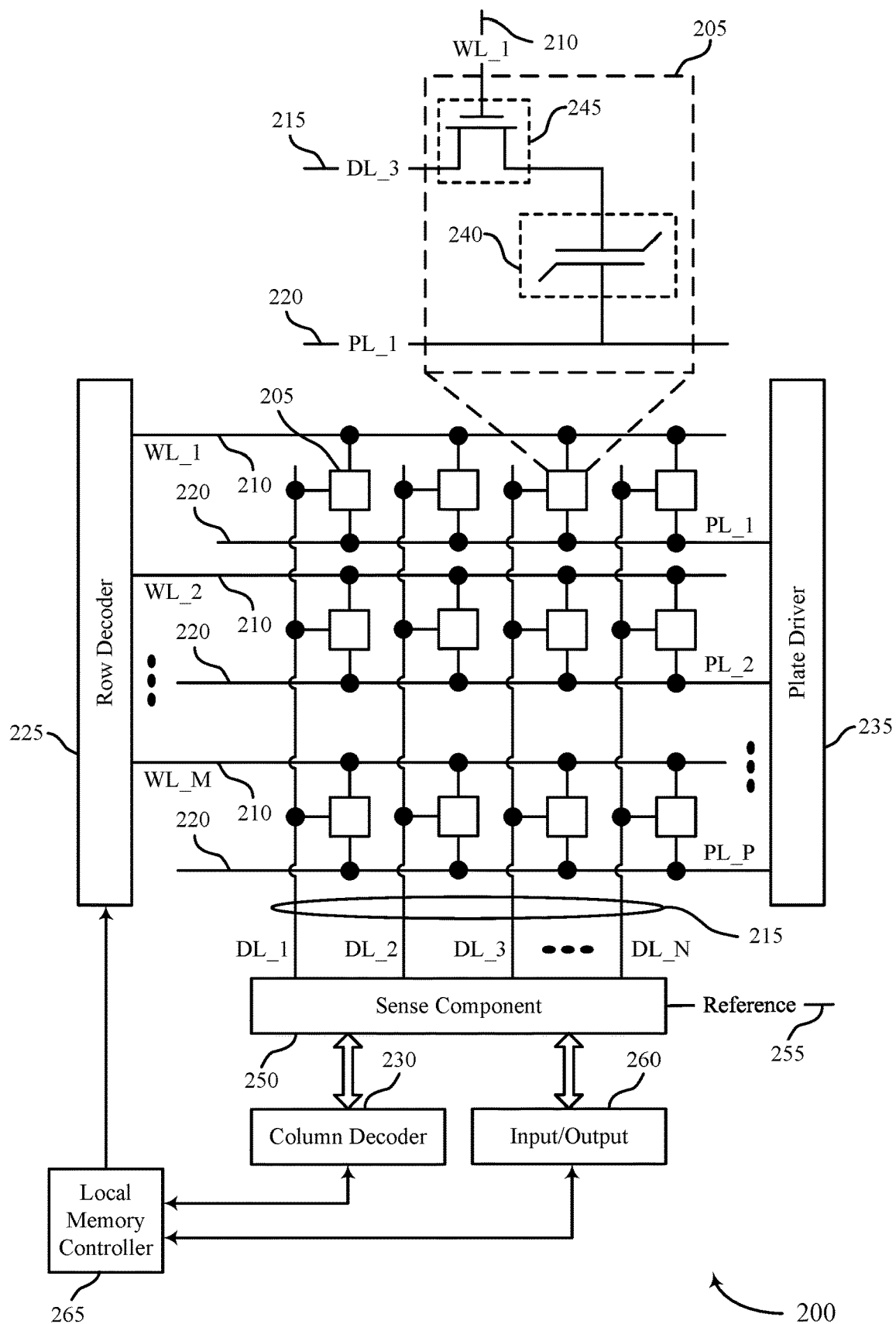
FIG. 2 illustrates an example of a memory die that supports inductive energy harvesting and signal development for a memory device in accordance with examples as disclosed herein.

FIG. 2 illustrates an example of a memory die 200 that supports inductive energy harvesting and signal development for a memory device in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may illustrate one example type of memory in which the techniques and structures described herein may be utilized; however, the techniques and structures described herein may be implemented in any type of memory.

The memory die 200 may include memory cells 205 that are programmable to store different states such as memory states, which may be referred to herein as memory values. Though the example memory cell 205 illustrated in FIG. 2 may be of a certain type (e.g., ferroelectric memory cells), it is to be understood that the memory cells 205 may be of any type.

In some cases, a memory cell 205 may be programmable to store two memory values, denoted a logic 0 and a logic 1. In some cases, a memory cell 205 may be programmable to store more than two memory values. Additionally or alternatively, a memory cell 205 may be programmable to store a memory state based on an analog or stochastic operation (e.g., related to a neural network), where the memory state correspond to information other than a logic 0 or a logic 1. In some examples, the memory cells 205 may include a capacitive memory element, a ferroelectric memory element, a material memory element, a resistive element, a self-selecting memory element, a thresholding memory element, or any combination thereof. In some examples, a memory cell 205 (e.g., a multi-level memory cell, such as a flash NAND multi-level cell (MLC), tri-level cell (TLC), or quad-level cell (QLC)) may be operable to store more than one bit of information at a time (e.g., a logic 00, logic 01, logic 10, a logic 11). The memory cells 205 may be arranged in an array, such as a memory array 170 described with reference to FIG. 1.

The set of memory cells 205 may be part of a memory section of the memory die 200 (e.g., including an array of memory cells 205), where in some examples a memory section may refer to a contiguous tile of memory cells 205 (e.g., a contiguous set of elements of a semiconductor chip). In some examples, a memory section may refer to the smallest set of memory cells 205 that may be biased in an access operation, or a smallest set of memory cells 205 that share a common node (e.g., a common plate line, a set of plate lines that are biased to a common voltage). Although a single memory section of the memory die 200 is shown, various examples of a memory device in accordance with examples as disclosed herein may have a set of memory sections. In one illustrative example, a memory die 200, or a subsection thereof (e.g., a core of a multi-core memory device, a chip of a multi-chip memory device) may include 32 "banks" and each bank may include 32 sections. Thus, a memory die 200, or subsection thereof, according to the illustrative example may include 1,024 memory sections. In some examples, memory cells 205 may be connected in a serial string (e.g., in a NAND configuration), where the serial string may be coupled with or form part of a bit line 215.

In the example illustrated in FIG. 2, a memory cell 205 may store an electric charge representative of the programmable memory values in a capacitor 240 (e.g., storing charge in a capacitor, capacitive memory element, capacitive storage element). In one example, a charged and uncharged capacitor 240 may represent two memory values, respectively. In another example, a positively charged and negatively charged capacitor 240 may represent two memory values, respectively. In some examples, such as FeRAM architectures, a memory cell 205 may include a capacitor 240 having a ferroelectric material as an insulating (e.g., non-conductive) layer between terminals of the capacitor. Different levels of polarization of the capacitor 240 may represent different memory values (e.g., supporting two or more memory values in a respective memory cell 205). In some examples, ferroelectric materials have non-linear polarization properties.

The capacitor 240 may be an example of a ferroelectric capacitor. The memory cell 205 may further include a switching component 245. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components. In some examples, a switching component 245 may be used as a storage component for the memory cell (e.g., capacitor 240 may not be present). For example, multiple switching components 245 may be connected to each other in serial fashion (e.g., as a string, possibly in a NAND configuration), with different switching components 245 corresponding to (e.g., functioning as) separate storage elements.

In some examples, a memory cell 205 may include a material portion, which may be referred to as a memory element, a memory storage element, a self-selecting memory element, or a self-selecting memory storage element. The material portion may have a variable and configurable electrical resistance or other characteristic that is representative of different memory values. For example, a material that can take the form of a crystalline atomic configuration or an amorphous atomic configuration (e.g., able to maintain either a crystalline state or an amorphous state over an ambient operating temperature range of the memory die 200) may have different electrical resistances depending on the atomic configuration. A more-crystalline state of the material (e.g., a single crystal, a collection of a relatively large crystal grains that may be substantially crystalline) may have a relatively low electrical resistance, and may alternatively be referred to as a "SET" memory value. A more-amorphous state of the material (e.g., an entirely amorphous state, some distribution of relatively small crystal grains that may be substantially amorphous) may have a relatively high electrical resistance, and may alternatively be referred to as a "RESET" memory value. Thus, a voltage applied to such a memory cell 205 may result in different current flow depending on whether the material portion of the memory cell 205 is in the more-crystalline or the more-amorphous state. Accordingly, the magnitude of the current resulting from applying a read voltage to the memory cell 205 may be used to determine a memory value stored by memory cell 205.

In some examples, a memory element may be configured with various ratios of crystalline and amorphous areas (e.g., varying degrees of atomic order and disorder) that may result in intermediate resistances, which may represent different memory values (e.g., supporting two or more memory values in a respective memory cell 205). Further, in some examples, a material or a memory element may have more than two atomic configurations, such as an amorphous configuration and two different crystalline configurations. Although described herein with reference to an electrical resistance of different atomic configurations, a memory device may use some other characteristic of a memory element to determine a stored memory value corresponding to an atomic configuration, or combination of atomic configurations.

In some cases, a memory element in a more-amorphous state may be associated with a threshold voltage. In some examples, electrical current may flow through a memory element in the more-amorphous state when a voltage greater than the threshold voltage is applied across the memory element. In some examples, electrical current may not flow through a memory element in the more-amorphous state when a voltage less than the threshold voltage is applied across the memory element. In some cases, a memory element in a more-crystalline state may not be associated with a threshold voltage (e.g., may be associated with a threshold voltage of zero). In some examples, electrical current may flow through a memory element in the more-crystalline state in response to a non-zero voltage across the memory element.

In some cases, a material in both the more-amorphous state and the more-crystalline state may be associated with threshold voltages. For example, self-selecting or thresholding memory may be based on differences in a threshold voltage of a memory cell between different programmed states (e.g., by way of different compositional distributions). The memory value of a memory cell 205 having such a memory element may be set by biasing or heating the memory element to a temperature profile over time that supports forming a particular atomic configuration, or combination of atomic configurations.

A memory die 200 may include a three-dimensional (3D) memory array, where a plurality of two-dimensional (2D) memory arrays (e.g., decks, levels) are formed on top of one another. In various examples, such arrays may be divided into a set of memory sections, where each memory section may be arranged within a deck or level, distributed across multiple decks or levels, or any combination thereof. Such arrangements may increase the number of memory cells 205 that may be placed or created on a single die or substrate as compared with 2D arrays, which in turn may reduce production costs or increase the performance of a memory die 200, or both. The decks or levels may be separated by an electrically insulating material. Each deck or level may be aligned or positioned so that memory cells 205 may be approximately aligned with one another across each deck, forming a stack of memory cells 205.

The memory die 200 may include access lines (e.g., word lines 210, bit lines 215, and plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, bit lines 215 may be referred to as column lines or digit lines. References to access lines, row lines, column lines, word lines, digit lines, bit lines, or plate lines, or their analogues, are interchangeable without loss of understanding or operation. Memory cells 205 may be positioned at intersections of the word lines 210, the bit lines 215, and/or the plate lines 220. In some examples, bit lines 215 may at least partially extend in a vertical direction (e.g., in a dimension corresponding to die height), such as for example a 3D Flash NAND configuration.

Operations such as reading and writing may be performed on memory cells 205 by activating or selecting access lines such as a word line 210, a bit line 215, and/or a plate line 220. By biasing a word line 210, a bit line 215, and a plate line 220 (e.g., applying a voltage to the word line 210, bit line 215, or plate line 220), a single memory cell 205 may be accessed at their intersection. Activating or selecting a word line 210, a bit line 215, or a plate line 220 may include applying a voltage to the respective line.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a bit line 215 based on the received column address. A plate driver 235 may receive a plate address from the local memory controller 265 and activates a plate line 220 based on the received plate address.

Selecting or deselecting the memory cell 205 may be accomplished by activating or deactivating the switching component 245. The capacitor 240 may be in electronic communication with the bit line 215 using a switching component 245. For example, the capacitor 240 may be isolated from bit line 215 when the switching component 245 is deactivated, and the capacitor 240 may be coupled with bit line 215 when the switching component 245 is activated.

In some cases (e.g., where the memory cell 205 comprises a NAND memory cell), multiple switching components 245 may be arranged in series, each of the switching components 245 corresponding to a different memory cell 205, and selection may be achieved by placing some switching components 245 in bypass mode via their control gates and by sensing a conductivity state for one or more other switching components 245 (which are not placed in bypass mode). In addition, when sensing a conductivity state of a memory cell 205 (e.g., switching component 245) selected in this manner, a search (e.g., scan) for a threshold voltage of the selected memory cell 205 may be performed. For example, a voltage at which a transition occurs from the selected memory cell 205 being in a nonconductive state to being in a conductive state (or vice versa from conductive to nonconductive state) may be used to determine a logic value stored by the memory cell 205.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be operable to control the switching component 245 of the memory cell. In some architectures, the word line 210 may be in electronic communication with a node of the capacitor of the memory cell 205 and the memory cell 205 may not include a switching component. In some architectures, the word line 210 may be in electronic communication with a switching component 245 and the switching component 245 may function as a storage component for the memory cell 205 (e.g., based on an amount of charge that is present or absent from a floating gate included in the switching component 245).

A bit line 215 may be a conductive line that connects the memory cell 205 with a sense component 250. In some architectures, the memory cell 205 may be selectively coupled with the bit line 215 during portions of an access operation. For example, the word line 210 and the switching component 245 of the memory cell 205 may be operable to selectively couple and/or isolate the capacitor 240 of the memory cell 205 and the bit line 215. In some architectures, the memory cell 205 may be in electronic communication (e.g., constant) with the bit line 215.

The sense component 250 may determine a state (e.g., a polarization state or a charge) stored on the capacitor 240 of the memory cell 205 and determine a memory value of the memory cell 205 based on the detected state. The sense component 250 may include one or more sense amplifiers to amplify the signal output of the memory cell 205. The sense component 250 may compare the signal received from the memory cell 205 across the bit line 215 to a reference 255 (e.g., a reference voltage). The detected memory value of the memory cell 205 may be provided as an output of the sense component 250 (e.g., to an input/output 260), and may indicate the detected memory value to another component of a memory device 110 that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 265 may generate row signals and column address signals to activate the target word line 210, the target bit line 215, and the target plate line 220. The local memory controller 265 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, an activate operation, an erase operation, or a program operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The local memory controller 265 may be operable to perform a write operation (e.g., a programming operation) on one or more memory cells 205 of the memory die 200. During a write operation, a memory cell 205 of the memory die 200 may be programmed to store a desired memory value. The local memory controller 265 may identify a target memory cell 205 on which to perform the write operation. The local memory controller 265 may identify a target word line 210, a target bit line 215, and a target plate line 220 coupled with the target memory cell 205. The local memory controller 265 may activate the target word line 210, the target bit line 215, and the target plate line 220 (e.g., applying a voltage to the word line 210, bit line 215, or plate line 220) to access the target memory cell 205. The local memory controller 265 may apply a specific signal (e.g., write pulse) to the bit line 215 during the write operation to store a specific state (e.g., charge) in the capacitor 240 of the memory cell 205. The pulse used as part of the write operation may include one or more voltage levels over a duration.

The local memory controller 265 may be operable to perform a read operation (e.g., a sense operation) on one or more memory cells 205 of the memory die 200. During a read operation, the memory value stored in a memory cell 205 of the memory die 200 may be determined. The local memory controller 265 may identify a target memory cell 205 on which to perform the read operation. The local memory controller 265 may identify a target word line 210, a target bit line 215, and target plate line 220 coupled with the target memory cell 205. The local memory controller 265 may activate the target word line 210, the target bit line 215, and the target plate line 220 (e.g., applying a voltage to the word line 210, bit line 215, or plate line 220) to access the target memory cell 205. The target memory cell 205 may transfer a signal to the sense component 250 in response to biasing the access lines. The sense component 250 may amplify the signal. The local memory controller 265 may activate the sense component 250 (e.g., latch the sense component) and thereby compare the signal received from the memory cell 205 to the reference 255. Based on that comparison, the sense component 250 may determine a memory value that is stored on the memory cell 205.

In some examples, the memory die 200 may include or be coupled with one or more inductors. For example, the inductors may be coupled with one or more components of the memory die 200. The inductors may harvest energy, for example based on a current routed through a component (e.g., the row decoder 225, the column decoder 230, the plate driver 235, the sense component 250, etc.) of the memory die 200. An inductor may then act as a current source based on the harvested energy. For example, an inductor may be used to provide current for various operations of the memory die 200 based on harvested energy. An inductor may harvest energy based on current being routed through the inductor or based on being inductively coupled with a second inductor through which current is routed. After harvesting energy, an inductor may provide current, and the current provided by the inductor may be used to drive access lines (e.g., the word lines 210, the bit lines 215, the plate lines 220, etc.) or otherwise as part of executing one or more operations (e.g., read operations, write operations, programming operations, etc.) for accessing a memory array of the memory die 200. Such inductor-supported operations may provide benefits such as improving energy efficiency of the memory die 200 or improving the drive strength of signals used to operate the memory die 200, among other benefits.

Figure 3:
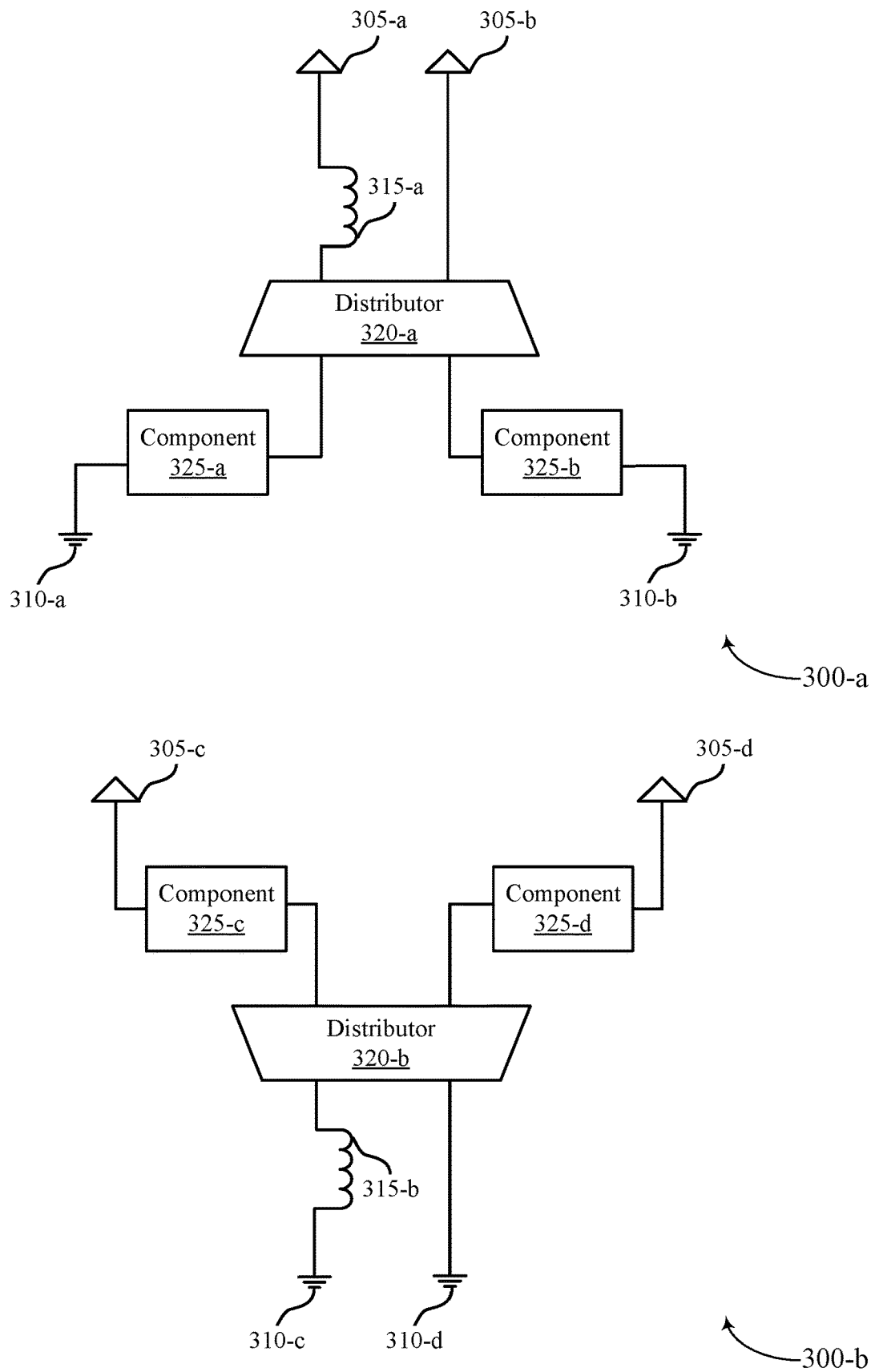
FIGS. 3 through 6 illustrate examples of circuits that support inductive energy harvesting and signal development for a memory device in accordance with examples as disclosed herein.

FIG. 3 illustrates examples of circuits 300 that support inductive energy harvesting and signal development for a memory device in accordance with examples as disclosed herein. In some examples, the circuits 300 may include one or more aspects of a memory die or a memory device as described with reference to FIGS. 1 and 2. For example, each circuit 300 may include one or more components 325, where each component 325 may include a memory array 170 or one or more parts of a memory array 170 as described with reference to FIGS. 1 and 2.

In some examples, a component 325 may represent gates of access transistors or drivers for a selected word line (e.g., a word line 210 as described with reference to FIG. 2). Additionally or alternatively, a component 325 may represent a set of bit lines coupled with memory cells (e.g., bit lines 215 coupled with memory cells 205 as described with reference to FIG. 2).

A circuit 300-a may be coupled with a power source (e.g., an external power source for a memory die) via power pins 305-a and 305-b and ground pins 310-a and 310-b. The power pins 305-a and 305-b may be coupled with a distributor 320-a. For example, the power pin 305-b may be directly coupled with the distributor 320-a, and the power pin 305-a may be coupled with the distributor 320-a via an inductor 315-a. The inductor 315-a may harvest energy based on a current routed through the inductor 315-a from the power pin 305-a to the distributor 320-a.

The distributor 320-a (e.g., a switching component, which may refer to a component that includes one or more switches and is operable to selectively couple and decouple two or more nodes) may switch connections for components 325-a and 325-b. For example, the distributor 320-a may initially route current via the inductor 315-a to the component 325-a. Based on the routed current, the inductor 315-a may receive and harvest energy. The distributor 320-a may switch the connections for the component 325-a such that current is routed to the component 325-a from the direct connection with the power pin 305-b. The distributor 320-a may additionally route current based on the harvested energy in the inductor 315-a to the component 325-b. The inductor 315-a may continue to deliver current based on the harvested energy. Accordingly, based on the switching, the component 325-b may receive a current boost from a controlled amount of charge provided by the inductor 315-a.

In some examples, the switching at the distributor 320-a may be dynamic based on non-overlapping power boost requirements for the components 325-a and 325-b. That is, the components 325-a and 325-b may provide a current boost to each other via the distributor 320-a. In some examples, the current boost may represent a ratio of a portion of current received from the inductor 315-*a* to a portion of current received from the power pin 305-*b*. This ratio may be dynamically changed or controlled by a power controller or distributor, such as the distributor 320-*a*. In some examples, each component 325 may operate in at least one of two modes, which may be referred to as a power-needing mode and a power-providing mode. In a power-providing mode, a component 325 may energize the inductor 315-*a*, for example by inducing current through the inductor 315-*a*, which may harvest and store energy in the form of current. In a power-needing mode, a component 325 may be coupled with one of more inductors 315 (e.g., including the inductor 315-*a*) containing harvested and stored energy, thus providing energy to the component 325 based on the coupling. Each component 325 may provide a signal to the power controller, where the signal conveys and requests the mode (e.g., the power-needing mode or the power-providing mode). The power controller or distributor may accordingly provide coupling with the inductors 315. For example, the inductors 315 with depleted energy may be coupled with components 325 in the power-providing mode, and inductors with harvested or stored energy may be coupled with components 325 in the power-needing mode. In some examples, the circuit 300-*a* may include additional components 325 (not shown) coupled with additional inductors 315 (not shown) via the distributor 320-*a* to provide additional non-overlapping opportunity windows for current boosts to the components 325.

An alternative configuration is illustrated in a circuit 300-*b*, where an inductor 315-*b* and a distributor 320-*b* may be coupled with ground pins 310-*c* and 310-*d*. In an example where the components 325 represent bit lines coupled with memory cells, the circuit 300-*a* may enable current boosts via the inductor 315-*a* and the distributor 320-*a*, where the current boosts may enable the components 325-*a* and 325-*b* (e.g., the bit lines) to efficiently deposit a charge with a positive value to memory cells. Similarly, the circuit 300-*b* may enable current boosts via the inductor 315-*b* and the distributor 320-*b*, where the current boosts may enable the components 325-*c* and 325-*d* to efficiently deposit a charge with a negative value to memory cells.

In some examples, the circuits 300-*a* and 300-*b* may be combined to provide current boosts for depositing positive or negative charges to memory cells. Such a combined circuit (not shown) may include a first set (e.g., one or more) of distributors 320 and a first set of inductors 315 coupled with a set of power pins 305, as well as a second set of distributors 320 and a second set of inductors 315 coupled with a set of ground pins 310. The sets of inductors 315 may harvest energy from current spikes of the power source at the power pins 305 and the ground pins 310 via electromagnetic induction.

The inductors 315 described herein may be located at various positions within a system. In some examples, inductors 315 may be included in a memory die, such as a memory die 200 as described with reference to FIG. 2, or inductors 315 may be included in a memory package (e.g., a memory device 110 as described with reference to FIG. 1), but not on the same die as other portions of the circuits 300. Additionally or alternatively, inductors 315 may be outside the memory package, but coupled with the portions of the circuits 300. For example, the inductors 315 may be located on a printed circuit board (PCB) to which the memory package is mounted.

In some examples, the inductors 315 of the circuits 300 may be coupled with capacitive elements (e.g., capacitive elements of a memory device or memory array) to store charge based on the harvested energy. The stored charge may be used to provide current boosts to the components 325, for example based on a command from a memory controller of a memory device.

In some examples, an inductor 315 may be coupled with a distributor 320 at two nodes. A first node may correspond to a first end of the inductor 315, and a second node may correspond to a second end of the inductor 315. The distributor 320 may couple a component 325 with the first node to provide a current boost in a first current direction, or the distributor 320 may couple the component 325 with the second node to provide a current boost in a second current direction, where the second current direction may be a reverse of the first current direction. Accordingly, an inductor 315 at a single pin (e.g., a power pin 305 or a ground pin 310) may enable a component 325 (e.g., a bit line) to efficiently deposit a charge with a positive value or a negative value to memory cells.

Figure 4:
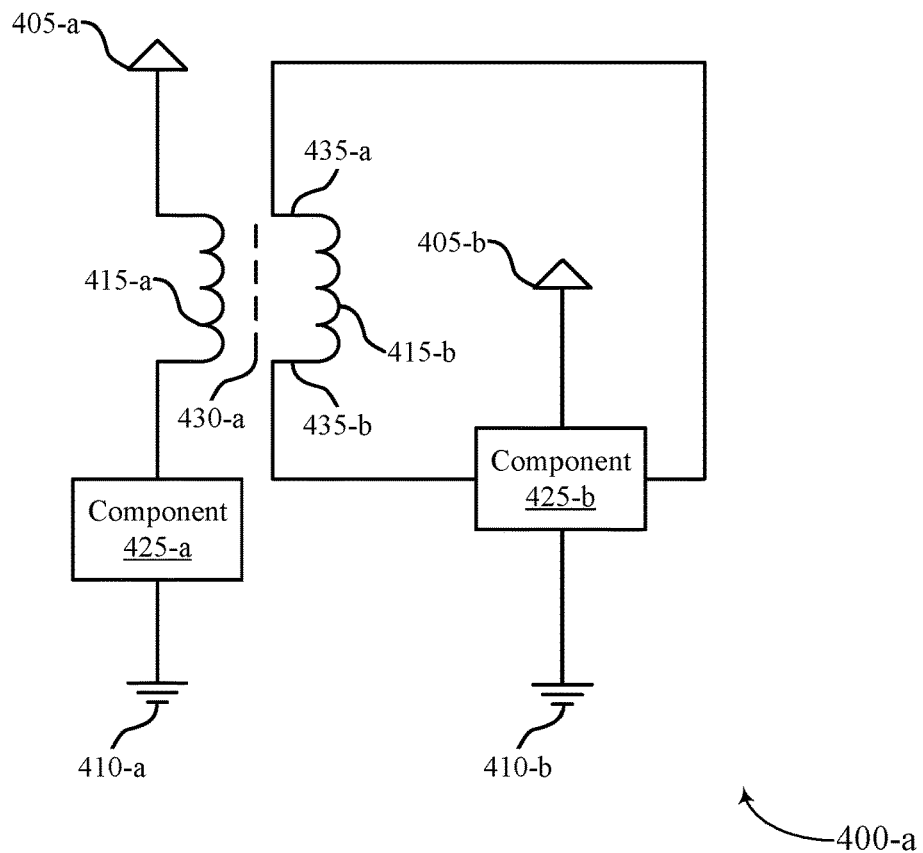
Figure 4:
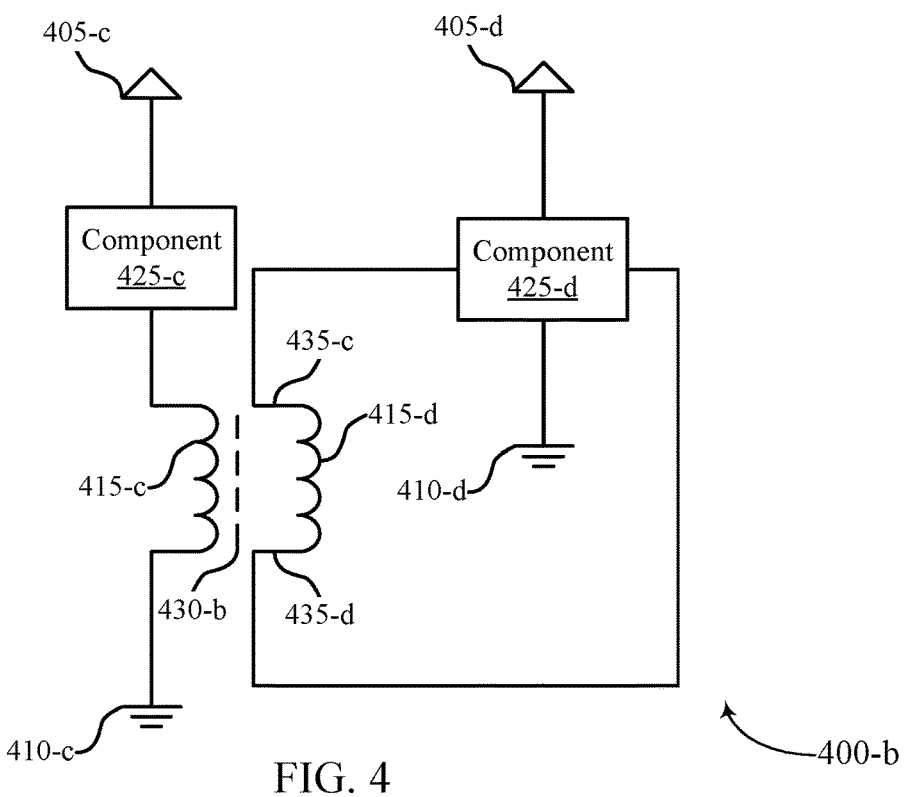

FIG. 4 illustrates an example of a circuit 400 that supports inductive energy harvesting and signal development for a memory device in accordance with examples as disclosed herein. In some examples, the circuits 400 may include one or more aspects of a memory die or a memory device as described with reference to FIGS. 1 and 2. For example, each circuit 400 may include one or more components 425, where each component 425 may include a memory array 170 or one or more parts of a memory array 170 as described with reference to FIGS. 1 and 2.

In some examples, a component 425 may represent gates of access transistors or drivers for a selected word line (e.g., a word line 210 as described with reference to FIG. 2). Additionally or alternatively, a component 425 may represent a set of bit lines coupled with memory cells (e.g., bit lines 215 coupled with memory cells 205 as described with reference to FIG. 2).

A circuit 400-*a* may be coupled with a power source (e.g., an external power source) via power pins 405-*a* and 405-*b* and ground pins 410-*a* and 410-*b*. The power pins 405-*a* and 405-*b* may be coupled with components 425-*a* and 425-*b*. For example, the power pin 405-*b* may be directly coupled with the component 425-*b*, and the power pin 405-*a* may be coupled with the component 425-*a* via an inductor 415-*a*. The inductor 415-*a* may harvest energy based on a current routed through the inductor 415-*a* from the power pin 405-*a* to the component 425-*a*. In some examples, the inductor 415-*a* may be included in the power pin 405-*a*, or the inductor 415-*a* may be used to produce an electromagnetic field, which may be be used for coupling with the power pin 405-*a*. This configuration may not implement energy harvesting at the inductor 415-*a*.

The inductor 415-*a* may be inductively coupled with an inductor 415-*b*. For example, each of inductors 415-*a* and 415-*b* may include a wire wound into coils about an axis 430-*a*. Alternatively or additionally, the inductors 415-*a* and 415-*b* may include materials configured to enhance generation of electromagnetic field used for coupling the inductors 415. The inductor 415-*a* may be located in close proximity to the inductor 415-*b*. As a routed current passes through the inductor 415-*a*, the routed current may create a magnetic field about the coiled wire of the inductor 415-*a*. The magnetic field about the inductor 415-*a* may pass through the coiled wire of the inductor 415-*b*, which may induce a voltage or a current in the inductor 415-*b*. The inductor 415-*b* may thus act as a voltage source or a current source for a component 425-*b*. For example, the inductor 415-*b* may provide a current boost to the component 425-*b* when acting as a voltage source.

In some examples, the energy harvested at an inductor 415 may be stored in the magnetic field about the wire of the inductor 415. Additionally or alternatively, the inductors 415 of the circuits 400 may be coupled with capacitive elements (e.g., capacitive elements of a memory device or memory array) to store charge based on the harvested energy. The stored charge or the energy stored in the magnetic field may be used to provide current boosts to the components 425, for example based on a command from a memory controller of a memory device.

An alternative configuration is illustrated in a circuit 400-b, where an inductor 415-c may be coupled with a ground pin 410-c. The inductor 415-c may be inductively coupled with an inductor 415-d, which in some cases may act as a voltage source or a current source for a component 425-d. In an example where the components 425 represent bit lines coupled with memory cells, the circuit 400-a may enable current boosts via the inductor 415-a or the inductor 415-b, where the current boosts may enable the components 425-a and 425-b (e.g., the bit lines) to efficiently deposit a charge with a positive value to memory cells. Similarly, the circuit 400-b may enable current boosts via the inductor 415-c or the inductor 415-d, where the current boosts may enable the components 425-c and 425-d to efficiently deposit a charge with a negative value to memory cells.

In some examples, the circuits 400-a and 400-b may be combined to provide current boosts for depositing positive or negative charges to memory cells. Such a combined circuit (not shown) may include a first set (e.g., one or more) of inductors 415 coupled with a set of power pins 405, as well as a second set of inductors 415 coupled with a set of ground pins 410. The sets of inductors 415 may harvest energy from current spikes of the power source at the power pins 405 and the ground pins 410 via electromagnetic induction. A plurality of current spikes in a chip (which may include one or more circuits 400) may produce fluctuation of an electromagnetic field which may cause electromagnetic interference of various blocks and components within a chip (e.g., components 425) or externally to the chip (or both). As a result, electromagnetic interference may induce undesirable parasitic electromagnetic coupling among components. This may create challenges in chip design targeted towards reduction of electromagnetic interference. By providing inductive coupling at each power pin 405 the electromagnetic field may be reduced and converted to additional source of energy. Thus, the techniques described herein may result in overall reduction of electromagnetic interference in addition to energy harvesting. In some examples, alternative to one-to-one inductive coupling between inductors 415 (e.g., the inductor 415-a inductively coupled with the inductor 415-b), it may be possible to couple fewer secondary inductors 415 with power pins 405 by routing the inductors 415 (e.g., on a chip surface, around a chip, among other examples) to reduce the electromagnetic interference.

The inductors 415 described herein may be located at various positions within a system. In some examples, inductors 415 may be included in a memory die, such as a memory die 200 as described with reference to FIG. 2, or inductors 415 may be included in a memory package (e.g., a memory device 110 as described with reference to FIG. 1), but not on the same die as other portions of the circuits 400. Additionally or alternatively, inductors 415 may be outside the memory package, but coupled with the portions of the circuits 400. For example, the inductors 415 may be located on a PCB to which the memory package is mounted.

In some examples, an inductor 415 may be coupled with a component 425 at two nodes 435. For example, a node 435-a may correspond to a first end of the inductor 415-b, and a node 435-b may correspond to a second end of the inductor 415-b. The inductor 415-b may be selectively configurable to route current in a first current direction (e.g., from the node 435-a to the node 435-b) or in a second current direction (e.g. from the node 435-b to the node 435-a) Accordingly, the inductor 415-b may be configurable to efficiently deposit a charge with a positive value or a negative value to memory cells coupled with the component 425-b. Similarly, the inductor 415-d may be coupled with the component 425-d at nodes 435-c and 435-d, where the inductor 415-d may be configurable to efficiently deposit a charge with a positive value or a negative value to memory cells coupled with the component 425-d.

Figure 5:
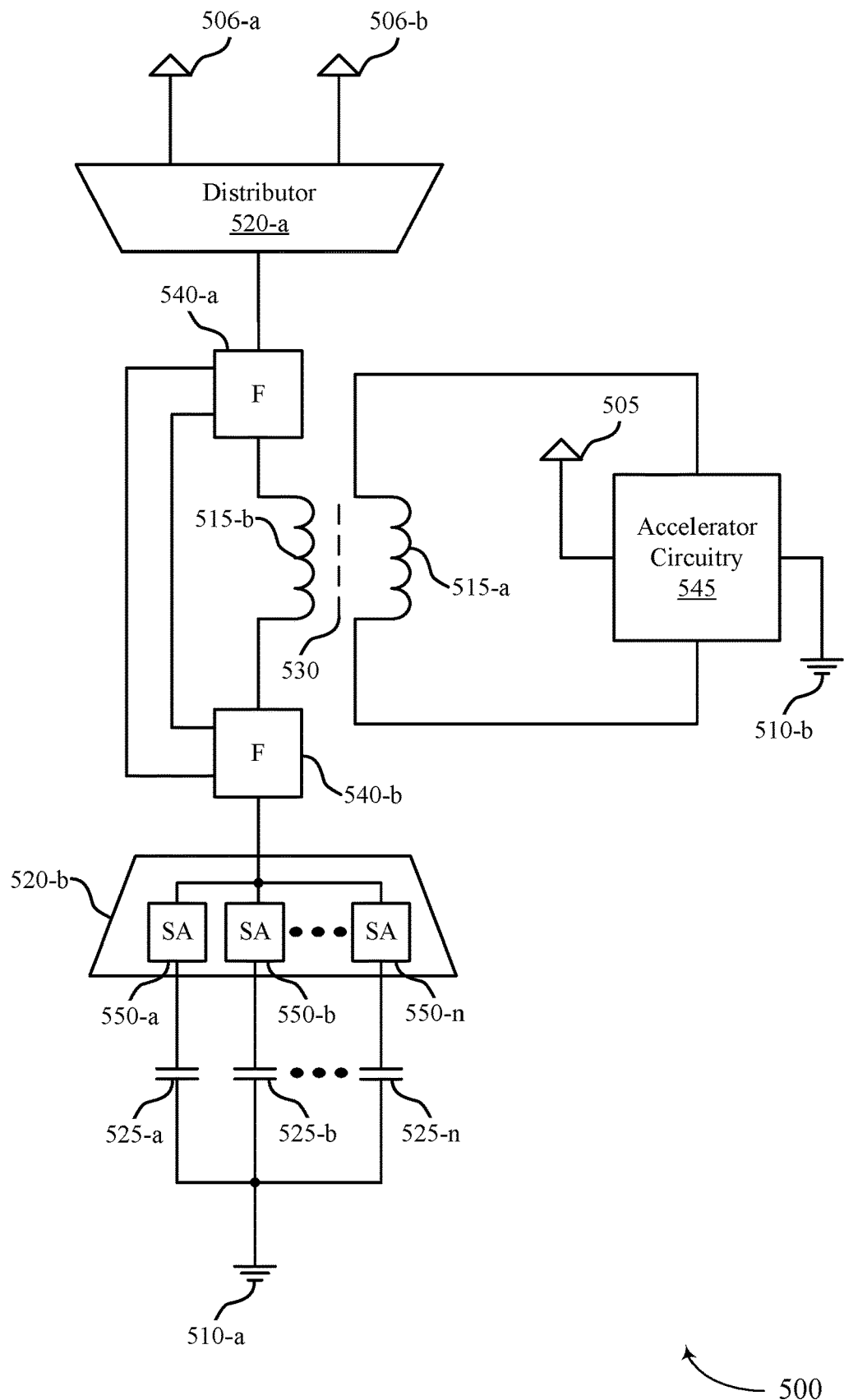

FIG. 5 illustrates an example of a circuit 500 that supports inductive energy harvesting and signal development for a memory device in accordance with examples as disclosed herein. In some examples, the circuit 500 may include one or more aspects of a memory die or a memory device as described with reference to FIGS. 1 and 2. For example, the circuit 500 may include one or more memory cells 525, where the memory cells 525 may be included in one or more memory arrays 170 as described with reference to FIGS. 1 and 2.

The circuit 500 may be coupled with a power source (e.g., an external power source) via a power pin 505 and ground pins 510-a and 510-b. The circuit 500 may be coupled with additional voltage sources via nodes 506-a and 506-b. In some examples, the node 506-a may be coupled with a first voltage source that has a first voltage level, and the node 506-b may be coupled with a second voltage source that has a second voltage level different from the first voltage level. Additionally or alternatively, the node 506-a may be referred to as a pulling node, and the node 506-b may be referred to as a pushing node. The voltage levels of the nodes 506 may be configured to pull or push negative or positive charge through components of the circuit 500. The nodes 506 may be coupled with a distributor 520-a (e.g., a switching component).

An inductor 515-a may be coupled with the power pin 505 and the ground pin 510-b via accelerating circuitry 545. In some examples, the accelerating circuitry 545 may include a current source. Additionally or alternatively, the accelerating circuitry may include one or more components of a memory die or a memory device as described with reference to FIGS. 1 and 2. The inductor 515-a may harvest energy based on a current routed through the inductor 515-a by the accelerating circuitry 545.

The inductor 515-a may be inductively coupled with an inductor 515-b. For example, each of inductors 515-a and 515-b may include a wire wound into coils about an axis 530-a. The inductor 515-a may be located in close proximity to the inductor 515-b. As a routed current passes through the inductor 515-a, the routed current may create a magnetic field about the coiled wire of the inductor 515-a. The magnetic field about the inductor 515-a may pass through the coiled wire of the inductor 515-b, which may induce a voltage in the inductor 515-b.

The inductors 515 described herein may be located at various positions within a system. In some examples, inductors 515 may be included in a memory die, such as a memory die 200 as described with reference to FIG. 2, or inductors 515 may be included in a memory package (e.g., a memory device 110 as described with reference to FIG. 1), but not on the same die as other portions of the circuit 500. Additionally or alternatively, inductors 515 may be outside the memory package, but coupled with the portions of the circuit

500. For example, the inductors 515 may be located on a PCB to which the memory package is mounted.

The inductor 515-*b* may be coupled with flipping circuitry 540-*a* and 540-*b*. The flipping circuitry 540-*a* and 540-*b* may be configurable to selectively couple either node of the inductor 515-*b* with distributor 520-*a* and the other node of the inductor 515-*b* with distributor 520-*b* such that the inductor 515-*b* may provide a boost current (e.g., based on the induced voltage due to the inductive coupling with the inductor 515-*a*) that flows in a first current direction (e.g., from the flipping circuitry 540-*a* to the flipping circuitry 540-*b*) or in a second current direction (e.g., from the flipping circuitry 540-*b* to the flipping circuitry 540-*a*) to efficiently provide energy or charge to another component of the circuit 500. For example, the distributor 520-*a* may include a capacitive plate, where a charge may be deposited on the capacitive plate based on the current boost from the inductor 515-*b*. In another example, the inductor 515-*b* may provide a current boost to a distributor 520-*b*. The distributor 520-*b* may include a set of sense amplifiers 550 coupled with the memory cells 525. In some examples, the inductor 515-*b* may provide a current boost to a memory cell 525 during an operation performed at a memory device, such as a read operation, a write operation, etc.

In some examples, the circuit 500 may be configured to perform a read operation for a memory cell 525-*a*. The inductor 515-*b* may provide a current boost such that a charge stored in the memory cell 525-*a* may be transferred via the distributor 520-*b* to the inductor 515-*b*, where the inductor 515-*b* may be coupled to the node 506-*a* (e.g., the pulling node) via the distributor 520-*a*. A sense amplifier 550-*a* in the distributor 520-*b* may sense the charge during the transfer to determine a memory value stored in the memory cell 525-*a*. In some examples, the transferred charge may be deposited on the capacitive plate of the distributor 520-*a*, where the charge may be reused for a subsequent operation of the circuit 500.

After the charge is transferred, the current direction through the inductor 515-*b* may be electrically flipped using the flipping circuitry 540-*a* and 540-*b*. In some examples, the distributor 520-*a* may decouple the inductor 515-*b* from the node 506-*a* and couple the inductor 515-*b* with the node 506-*b* (e.g., the pushing node). Based on the flipping and the coupling, the current in the inductor 515-*b* may flow to the memory cell 525-*a* via the sense amplifier 550-*a* to restore the charge in the memory cell 525-*a* as part of a write-back operation. In this way, the energy spent for the read operation may be partially reused for the write-back operation.

In some examples, the memory cells 525 may belong to different rows of a memory array. Multiple inductors 515 may be coupled (e.g., multiplexed) with the distributor 520-*b* (e.g., a row buffer or a row decoder, such as a row decoder 225 as described with reference to FIG. 2) such that a single inductor 515 (e.g., the inductor 515-*b*) may be coupled with a single memory cell (e.g., the memory cell 525-*a*) during an operation performed at a memory device, such as a read operation, a write operation, etc.

In some examples, the inductor 515-*b* may be selectively coupled with multiple memory cells 525 (e.g., memory cells 525-*a* through 525-*n*) via the distributor 520-*b*. The memory cells may store different types of data. For example, the memory cells 525-*a* and 525-*b* may store memory values as positive charges, and the memory cell 525-*n* may store a memory value as a negative charge. The distributor 520-*b* may selectively couple the inductor 515-*b* to memory cells 525 storing the same type of data to avoid different types of data canceling each other before being sensed at the sense amplifiers 550. In an example read operation, the distributor 520-*b* may couple the inductor 515-*b* with the memory cells 525-*a* and 525-*b* to transfer the positive charges through the sense amplifiers 550-*a* and 550-*b* to determine memory values, then decouple the inductor 515-*b* from the memory cells 525-*a* and 525-*b* and couple the inductor 515-*b* with the memory cell 525-*n* to transfer the negative charge through the sense amplifier 550-*n* to determine the memory value.

In some examples, the distributor 520-*b* may segregate the memory cells 525 according to the stored memory values using the sense amplifiers 550. For example, the distributor 520-*b* may provide a reference data value to the sense amplifiers 550 by coupling the sense amplifiers 550 to a common wire or bus (not shown). In some examples, the reference data value may be a +1 value, a −1 value, or another value corresponding to identifiable data. Based on the reference data value, the distributor 520-*b* may configure the sense amplifiers 550 to pass through memory values of memory cells 525 to the inductor 515-*b* when the memory values are equal to the reference data value during an operation. In some examples, the distributor 520-*b* may provide multiple reference data values to the sense amplifiers 550. For example, the memory cells 525 may be multi-state memory cells, where each memory cell 525 may be configured to concurrently store multiple memory values.

In some examples, an access line, such as a word line 210 as described with reference to FIG. 2, may be activated to couple memory cells 525 to sense amplifiers 550. Based on activating the access line, the sense amplifiers 550 may reinforce the data stored in the memory cells 525 and pass through charges to the inductor 515-*b* from memory cells 525 which store memory values that match the reference data value. In some examples, the sense amplifiers 550 coupled with memory cells 525 storing memory values that do not match the reference data value may retain, reinforce, and isolate the charge transferred from the memory cells 525. For example, the sense amplifiers 550 may perform a write-back operation to restore the charge transferred from the memory cell 525.

In some examples, the potential across the inductor 515-*b* due to the charge transferred from the memory cells 525 via the sense amplifiers 550 may induce a current through the inductor 515-*b*. The strength of the induced current may be based on the quantity of coupled memory cells 525 and their stored memory values. The current through the inductor 515-*b* may increase to a peak, and the current direction through the inductor 515-*b* may be flipped to direct the current back to the coupled sense amplifiers 550. Additionally or alternatively, the distributor 520-*b* may couple the inductor 515-*b* with a second set of sense amplifiers 550, and the current may be directed to memory cells 525 corresponding to the second set of sense amplifiers 550 as part of an operation performed at the memory device. In some examples, the current through the inductor 515-*b* may be reinforced using the nodes 506 or the inductive coupling with the inductor 515-*a*. In some examples, the induced current in the inductor 515-*b* may be used for other operations at the memory device, such as analog or mixed-signal computations (e.g., an analog population count).

Figure 6:
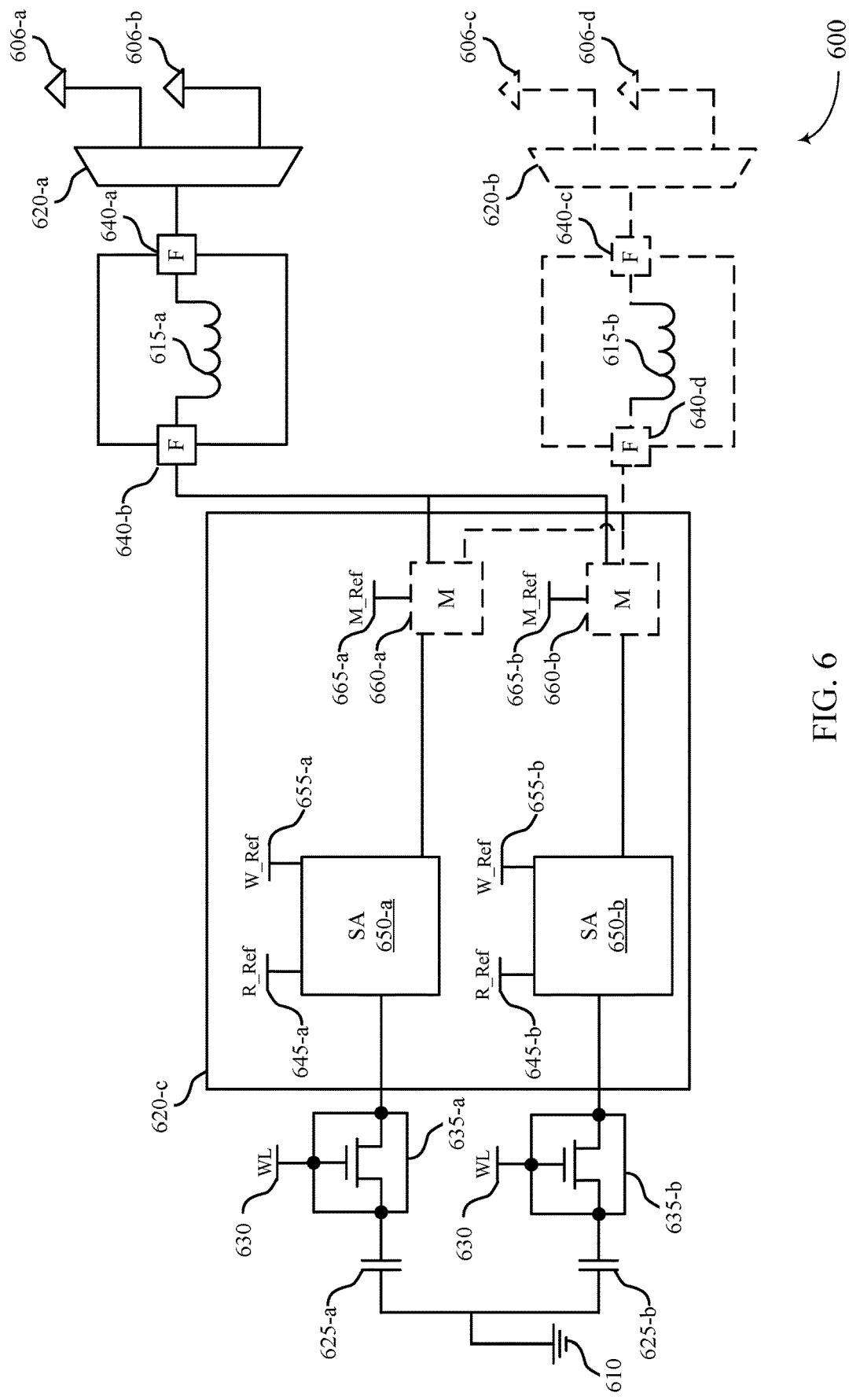

FIG. 6 illustrates an example of a circuit 600 that supports inductive energy harvesting and signal development for a memory device in accordance with examples as disclosed herein. In some examples, the circuit 600 may include one or more aspects of a memory die or a memory device as described with reference to FIGS. 1 and 2. For example, the circuit 600 may include one or more memory cells 625, where the memory cells 625 may be included in one or more memory arrays 170 as described with reference to FIGS. 1 and 2.

The circuit 600 may be coupled with a ground reference (e.g., a ground of a memory device or a memory array) via a ground pin 605. The circuit 600 may be coupled with additional voltage sources via nodes 606-*a* and 606-*b*. In some examples, the node 606-*a* may be coupled with a first voltage source that has a first voltage level, and the node 606-*b* may be coupled with a second voltage source that has a second voltage level different from the first voltage level. Additionally or alternatively, the node 606-*a* may be referred to as a pulling node, and the node 606-*b* may be referred to as a pushing node. The voltage levels of the nodes 606 may be configured to pull or push negative or positive charge through components of the circuit 600. The nodes 606-*a* and 606-*b* may be coupled with a distributor 620-*a* (e.g., a switching component). In some examples, the circuit 600 may also be coupled to the additional voltage sources via nodes 606-*c* and 606-*d*, where the node 606-*c* may be coupled with the first voltage source and the node 606-*d* may be coupled with the second voltage source. The nodes 606-*c* and 606-*c* may be coupled with a distributor 620-*b*.

The distributor 620-*a* may be coupled with an inductor 615-*a*, which may be coupled with flipping circuitry 640-*a* and 640-*b*. The flipping circuitry 640-*a* and 640-*b* may be configurable to selectively couple either node of the inductor 615-*a* with distributor 620-*a* and the other node of the inductor 615-*a* with distributor 620-*c* such that the inductor 615-*a* may provide a current boost in a first current direction (e.g., from the flipping circuitry 640-*a* to the flipping circuitry 640-*b*) or a second current direction (e.g., from the flipping circuitry 640-*b* to the flipping circuitry 640-*a*) to efficiently deposit a charge to another component of the circuit 600. For example, the distributor 620-*a* may include a capacitive plate, where a charge may be deposited on the capacitive plate based on the current boost from the inductor 615-*a*. In some examples, the circuit 600 may also include an inductor 615-*b* coupled with the distributor 620-*b* and flipping circuitry 640-*c* and 640-*d*. In some examples, the operations described herein that include the inductor 615-*a* and the distributor 620-*a* may additionally or alternatively be accomplished using the inductor 615-*b* and the distributor 620-*b*.

The inductors 615 described herein may be located at various positions within a system. In some examples, inductors 615 may be included in a memory die, such as a memory die 200 as described with reference to FIG. 2, or inductors 615 may be included in a memory package (e.g., a memory device 110 as described with reference to FIG. 1), but not on the same die as other portions of the circuit 600. Additionally or alternatively, inductors 615 may be outside the memory package, but coupled with the portions of the circuit 600. For example, the inductors 615 may be located on a PCB to which the memory package is mounted.

In some examples, the inductor 615-*a* may provide a current boost to a distributor 620-*c*. The distributor 620-*c* may include a set of sense amplifiers 650 coupled with the memory cells 625. In some examples, the inductor 615-*a* may provide a current boost to a memory cell 625 during an operation performed at a memory device, such as a read operation, a write operation, etc.

In some examples, the circuit 600 may be configured to perform a read operation for a memory cell 625-*a*. The inductor 615-*a* may provide a current boost such that a charge stored in the memory cell 625-*a* may be transferred via the distributor 620-*c* to the inductor 615-*a*, where the inductor 615-*a* may be coupled to the node 606-*a* (e.g., the pulling node) via the distributor 620-*a*. A sense amplifier 650-*a* in the distributor 620-*c* may sense the charge during the transfer to determine a memory value stored in the memory cell 625-*a*. In some examples, the transferred charge may be deposited on the capacitive plate of the distributor 620-*a*, where the charge may be reused for a subsequent operation of the circuit 600.

After the charge is transferred, the current direction through the inductor 615-*a* may be flipped using the flipping circuitry 640-*a* and 640-*b*. In some examples, the distributor 620-*a* may decouple the inductor 615-*a* from the node 606-*a* and couple the inductor 615-*a* with the node 606-*b* (e.g., the pushing node). Based on the flipping and the coupling, the current in the inductor 615-*a* may flow to the memory cell 625-*a* via the sense amplifier 650-*a* to restore the charge in the memory cell 625-*a* as part of a write-back operation. In this way, the energy spent for the read operation may be partially reused for the write-back operation.

In some examples, the memory cells 625 may belong to different rows of a memory array. Multiple inductors 615 may be coupled (e.g., multiplexed) with the distributor 620-*c* (e.g., a row buffer or a row decoder, such as a row decoder 225 as described with reference to FIG. 2) such that a single inductor 615 (e.g., the inductor 615-*a*) may be coupled with a single memory cell (e.g., the memory cell 625-*a*) during an operation performed at a memory device, such as a read operation, a write operation, etc.

In some examples, the inductor 615-*a* may be selectively coupled with multiple memory cells 625 via the distributor 620-*c*. The memory cells may store different types of data. For example, the memory cells 625-*a* may store a memory values as a positive charge, and the memory cell 625-*b* may store a memory value as a negative charge. The distributor 620-*c* may selectively couple the inductor 615-*a* to memory cells 625 storing the same type of data to avoid different types of data canceling each other before being sensed at the sense amplifiers 650. In an example read operation, the distributor 620-*c* may couple the inductor 615-*a* with the memory cell 625-*a* to transfer the positive charge through the sense amplifiers 650-*a* to determine memory value, then decouple the inductor 615-*a* from the memory cell 625-*a* and couple the inductor 615-*a* with the memory cell 625-*b* to transfer the negative charge through the sense amplifier 650-*b* to determine the memory value.

In some examples, the distributor 620-*c* may segregate the memory cells 625 according to the stored memory values using the sense amplifiers 650. For example, each sense amplifier 650 may be coupled with a read reference (R_Ref) node 645 and a write reference (W_Ref) node 655.

In an example read operation, the distributor 620-*c* may provide a read reference value to each sense amplifier 650 by coupling the R_Ref nodes 645 to a common wire or bus (not shown). In some examples, the read reference value may be a +1 value, a −1 value, or another value corresponding to identifiable data. Additionally or alternatively, the read reference value may correspond to a voltage offset value. Based on the read reference value, the distributor 620-*c* may configure the sense amplifiers 650 to pass through memory values of memory cells 625 to the inductor 615-*a* when the memory values are equal to the read reference value during the read operation. For example, the read reference value may enable the sense amplifiers 650 to detect a state of interest at one or more bit lines (e.g., a bit line 215 as described with reference to FIG. 2), where the state of interest identifies the memory cells 625 storing memory values equal to the read reference value. Additionally or alternatively, the read reference value may provide a driving voltage to energize the inductor 615-*a* upon detection of the state of interest at the bit lines.

In some examples, a word line 630 (e.g., a word line 210 as described with reference to FIG. 2) may be activated to couple memory cells 625 with sense amplifiers 650 via transistors 635. Based on activating the word line 630, the sense amplifiers 650 may reinforce the data stored in the memory cells 625 and pass through charges to the inductor 615-*a* from memory cells 625 which store memory values that match a reference value. In some examples, the sense amplifiers 650 coupled with memory cells 625 storing memory values that do not match the reference value may retain, reinforce, and isolate the charge transferred from the memory cells 625.

In some examples, the sense amplifiers 650 may be configured to detect one or more states at the memory cells 625. For example, the sense amplifiers 650 may be configured to detect states above or below the read reference value. Additionally or alternatively, each sense amplifier 650 may be configured with a unique read reference value, which may enable the sense amplifiers 650 to detect if the memory cells 625 contain a pattern encoded as a sequence of memory values. The sense amplifiers 650 may further be configured to detect if the memory cells 625 contain patterns above or below the set of read reference values at the sense amplifiers 650.

Similarly, in an example write operation, the distributor 620-*c* may provide a write reference value to a set of sense amplifiers 650 by coupling the W_Ref nodes 645 to a common wire or bus (not shown). Based on the write reference value, the distributor 620-*c* may configure the set of sense amplifiers 650 to write memory values to corresponding memory cells 625, for example using a current boost from the inductor 615-*a*. In some examples, the write operation may be part of a write-back operation, where the distributor 620-*c* may select the set of sense amplifiers 650 based on the memory cells 625 which match the read reference value used during a read operation preceding the write-back operation. In some examples, the write reference value may differ from the read reference value based on modifications according to an algorithm, such as an algorithm associated with a neural network.

In some examples, the distributor 620-*c* may provide multiple reference values to the sense amplifiers 650. For example, the distributor may provide one or more read reference values via the R_Ref nodes 645 and one or more write reference values via the W_Ref nodes 655. In some examples, the memory cells 625 may be multi-state memory cells, where each memory cell 625 may be configured to concurrently store multiple memory values.

In some examples, the distributor 620-*c* may enable concurrent reads by providing multiple read reference values to the sense amplifiers 650 while the word line 630 is activated. A first read reference value may be provided to the sense amplifiers 650, enabling a first charge to be transferred from a first set of memory cells 625 to the inductor 615-*a* via a set of multiplexers 660, where the first charge may correspond to the first read reference value. The multiplexers 660 may be configured to route current to the inductor 615-*a* based on a first multiplexer reference value, which may be provided to the multiplexers 660 via multiplexer reference (M_Ref) nodes 665. The first multiplexer reference value may be based on the first read reference value.

After routing the current based on the first read reference value, the distributor 620-*c* may provide a second read reference value to the sense amplifiers 650. The second read reference value may enable a second charge to be transferred from a second set of memory cells 625 to the inductor 615-*b* via the multiplexers 660, where the second charge may correspond to the second read reference value. The multiplexers 660 may be configured to route current to the inductor 615-*b* based on a second multiplexer reference value, which may be based on the second read reference value. In some examples, memory values may be read from the first and second sets of memory cells 625 based on the second read reference value. In some examples, the distributor 620-*c* may enable concurrent writes using similar techniques by providing multiple write reference values to the sense amplifiers 650 while the word line 630 is activated.

Figure 7:
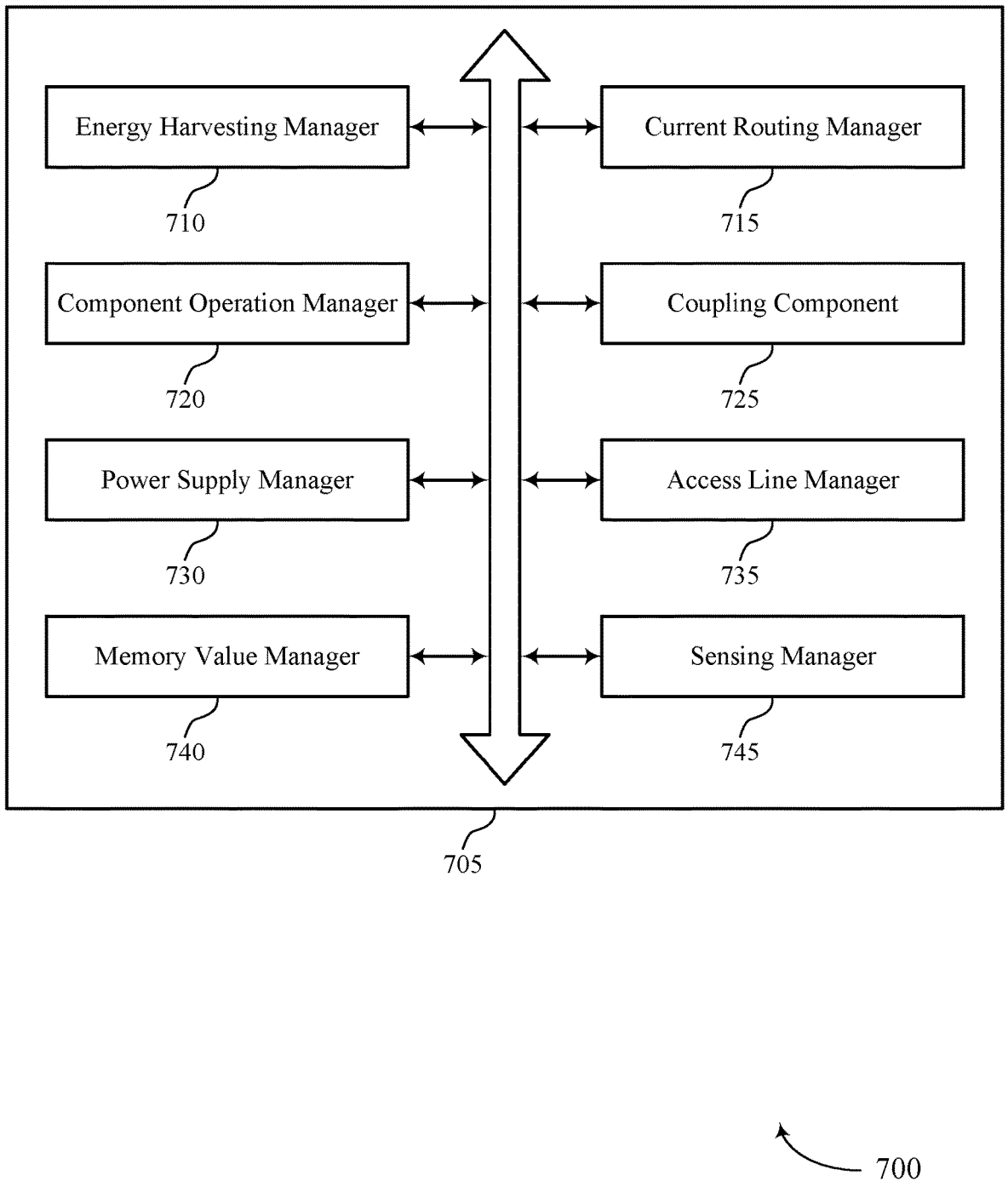
FIG. 7 shows a block diagram of a memory device that supports inductive energy harvesting and signal development for a memory device in accordance with aspects of the present disclosure.

FIG. 7 shows a block diagram 700 of a memory device 705 that supports inductive energy harvesting and signal development for a memory device in accordance with examples as disclosed herein. The memory device 705 may be an example of aspects of a memory device or a memory array as described with reference to FIGS. 1 and 2. The memory device 705 may include an energy harvesting manager 710, a current routing manager 715, a component operation manager 720, a coupling component 725, a power supply manager 730, an access line manager 735, a memory value manager 740, and a sensing manager 745. Each of these modules may communicate, directly or indirectly, with one another (e.g., via one or more buses).

The energy harvesting manager 710 may harvest energy associated with a memory device using an inductor.

In some examples, the energy harvesting manager 710 may harvest, using each inductor of the set of indicators, energy associated with the respective current during the first time interval.

In some examples, the energy harvesting manager 710 may harvest energy associated with the memory device using a second inductor.

In some examples, the energy harvesting manager 710 may harvest energy associated with the memory device using a second inductor, where the inductor is coupled with a first voltage reference and the second inductor is coupled with a second voltage reference different from the first voltage reference.

The current routing manager 715 may route current from the inductor to a component of the memory device, where the routed current is based on the energy harvested using the inductor.

In some examples, the current routing manager 715 may route a second current to a second component of the memory device, where the second current passes through the inductor and the harvesting is based on the second current passing through the inductor.

In some examples, the current routing manager 715 may route a respective current to each component of a set of components of the memory device during a first time interval, where the respective current to each component passes through a respective inductor of the set of inductors.

In some examples, the current routing manager 715 may route current from at least one inductor of the set of inductors to a second respective component of the memory device during a second time interval, where the second time interval is non-overlapping with the first time interval.

In some examples, the current routing manager 715 may route a second current from the second inductor to a second access line of the memory array that is coupled with a second memory cell, where the second current is based on the energy harvested using the second inductor and flows in a different direction than the routed current associated with the inductor.

In some examples, the current routing manager 715 may route a second current from the second inductor to the component of the memory array, where the second current is based on the energy harvested using the second inductor, and where reading or writing the memory cell is based on the second current.

In some examples, the current routing manager 715 may route a second current through a second inductor, where the inductor is inductively coupled with the second inductor, and where the energy harvested using the inductor is based on the second current through the second inductor.

In some examples, the current routing manager 715 may route a second current through a second inductor while the second node of the inductor is coupled with the switching component, where the inductor is inductively coupled with the second inductor.

The component operation manager 720 may operate the component of the memory device based on the routed current.

The coupling component 725 may decouple the inductor from the second component of the memory device.

In some examples, the coupling component 725 may couple the inductor with the component, where routing the current from the inductor to the component is based on coupling the inductor with the component.

In some examples, the coupling component 725 may decouple, after the first current is routed through the inductor, a first node of the inductor from the switching component and a second node of the inductor from a node having a first voltage.

In some examples, the coupling component 725 may couple, after the decoupling, the second node of the inductor with the switching component and the first node of the inductor with a node having a second voltage, where routing the current from the inductor to the component is based on coupling the second node of the inductor with the switching component; and the operating includes writing the memory value to the first memory cell or to a second memory cell within the memory device.

In some examples, the coupling component 725 may couple a set of storage elements each within a respective memory cell of a set of memory cells with a respective sense component of a set of sense components.

In some examples, the coupling component 725 may couple a set of storage elements each within a respective memory cell of a set of memory cells with a respective sense component of a set of sense components.

The power supply manager 730 may determine to increase an amount of power supplied to the component of the memory device, where routing the current from the inductor to the component is based on the determining.

The access line manager 735 may activate the access line using the driver and based on the routed current.

In some examples, the access line manager 735 may read or writing the memory cell based on activating the access line.

The memory value manager 740 may write a memory value to the memory cell via the access line and based on the routed current.

In some examples, the memory value manager 740 may write a second memory value to a second memory cell based on the second current.

In some examples, the memory value manager 740 may read a memory value from a first memory cell within the memory device, where a switching component routes a first current through the inductor based on reading the memory value, and where the energy harvested using the inductor is based on the first current.

In some examples, the memory value manager 740 may read a memory value from a memory cell within the memory device, where a switching component routes a first current through the inductor based on reading the memory value, and where the energy harvested using the inductor is based on the first current.

In some examples, the memory value manager 740 may store charge to a capacitor based on the first current being routed through the inductor, where the capacitor is coupled with the inductor.

In some examples, the memory value manager 740 may discharge the capacitor, where the operating includes writing the memory value to the memory cell or to a second memory cell within the memory device based on the discharging.

In some examples, the memory value manager 740 may determine, based on the common signal, that a memory value for each of the one or more memory cells is included in a set of one or more memory values.

In some examples, the memory value manager 740 may read a second memory value from at least a second subset of the set of memory cells or from a second set of memory cells based on a second set of one or more of the set of sense components coupling the inductor with the voltage source associated with the second read reference voltage.

In some examples, the memory value manager 740 may write a second memory value to at least a second subset of the set of memory cells or to a second set of memory cells based on a second set of one or more of the set of switching components coupling the node of the inductor with a second set of one or more of the set of second access lines.

In some examples, the memory value manager 740 may write a second memory value to at least a second subset of the set of memory cells based on a second set of one or more of the set of sense components coupling the second inductor with the respective second access line.

In some cases, the memory value is concurrently written to a first set of memory cells based on the energy harvested using the inductor, the first set of memory cells including the memory cell.

In some cases, the second memory value is concurrently written to a second set of memory cells based on the energy harvested using the second inductor, the second set of memory cells including the second memory cell.

The sensing manager 745 may bias a respective node of each of the set of sense components to a read reference voltage.

In some examples, the sensing manager 745 may develop, using a set of one or more sense components of the set of sense components, a common signal for one or more memory cells of the set of memory cells based on the read reference voltage.

In some examples, the sensing manager 745 may bias the respective node of each of the set of sense components to a second read reference voltage, where each of the set of sense components is operable to couple the inductor with a voltage source associated with the second read reference voltage based on the second read reference voltage and the memory value for the respective memory cell.

In some examples, the sensing manager 745 may bias a respective input for each of set of multiplexing components to a first voltage, where the set of multiplexing components couple the set of sense components with the inductor based on the first voltage.

In some examples, the sensing manager 745 may bias the respective node of each of the set of sense components to a second read reference voltage while the set of storage elements remain coupled with the set of sense components, where each of the set of sense components is operable to couple the inductor with a voltage source associated with the second read reference voltage based on the second read reference voltage and the memory value for the respective memory cell.

In some examples, the sensing manager 745 may bias the respective input for each of set of multiplexing components to a second voltage, where the set of multiplexing components couple the set of sense components with a second inductor based on the second voltage.

In some examples, the sensing manager 745 may read a second memory value from at least a second subset of the set of memory cells based on a second set of one or more of the set of sense components coupling the second inductor with the voltage source associated with the second read reference voltage.

In some examples, the sensing manager 745 may bias a respective node of each of a set of sense components to a write reference voltage, where each of the set of sense components is operable to couple a node of the inductor with the respective memory cell based on a voltage of the node of the inductor and the write reference voltage and the operating includes writing a memory value to at least a subset of the set of memory cells based on a set of one or more of the set of sense components coupling the node of the inductor with a set of one or more of the set of memory cells.

In some examples, the sensing manager 745 may bias the respective node of each of the set of sense components to a second write reference voltage, where each of the set of sense components is operable to couple the node of the inductor with the respective memory cell based on the voltage of the node of the inductor and the second write reference voltage.

In some examples, the sensing manager 745 may bias a respective input for each of set of multiplexing components to a first voltage, where the set of multiplexing components couple the set of sense components with the node of the inductor based on the first voltage.

In some examples, the sensing manager 745 may bias the respective node of each of the set of sense components to a second write reference voltage while the set of storage elements remain coupled with the set of sense components, where each of the set of sense components is operable to couple the node of the inductor with the respective memory cell based on the voltage of the node of the inductor and the second write reference voltage.

In some examples, the sensing manager 745 may bias the respective input for each of set of multiplexing components to a second voltage, where the set of multiplexing components couple the set of sense components with a second inductor based on the second voltage.

In some cases, each of the set of sense components is operable to couple an inductor with a voltage source associated with the read reference voltage based on the read reference voltage and a memory value for the respective memory cell.

In some cases, the common signal is developed and the energy is harvested using the inductor based on the set of one or more sense components coupling the voltage source with the inductor.

Figure 8:
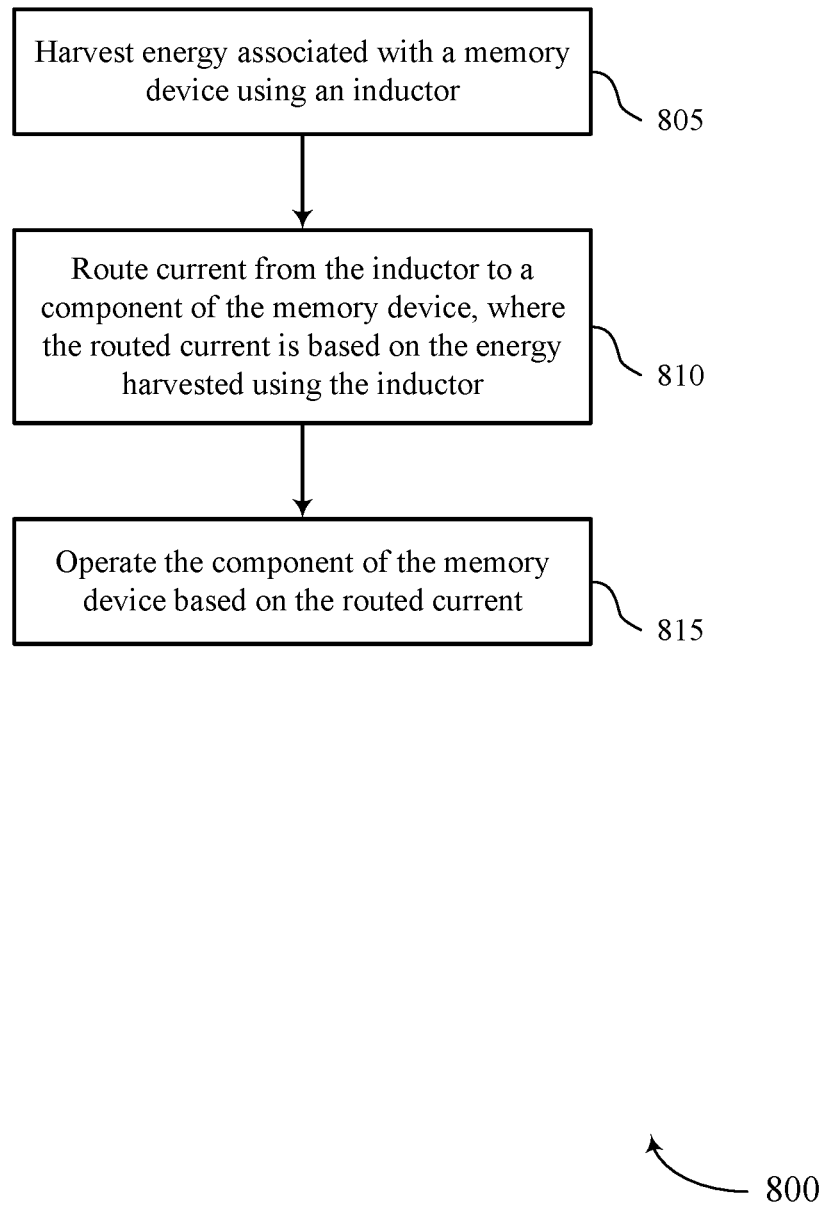
FIGS. 8 through 13 show flowcharts illustrating a method or methods that support inductive energy harvesting and signal development for a memory device in accordance with examples as disclosed herein.

FIG. 8 shows a flowchart illustrating a method or methods 800 that supports inductive energy harvesting and signal development for a memory device in accordance with aspects of the present disclosure. The operations of method 800 may be implemented by a memory device or its components as described herein. For example, the operations of method 800 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 805, the memory device may harvest energy associated with a memory device using an inductor. The operations of 805 may be performed according to the methods described herein. In some examples, aspects of the operations of 805 may be performed by an energy harvesting manager as described with reference to FIG. 7.

At 810, the memory device may route current from the inductor to a component of the memory device, where the routed current is based on the energy harvested using the inductor. The operations of 810 may be performed according to the methods described herein. In some examples, aspects of the operations of 810 may be performed by a current routing manager as described with reference to FIG. 7.

At 815, the memory device may operate the component of the memory device based on the routed current. The operations of 815 may be performed according to the methods described herein. In some examples, aspects of the operations of 815 may be performed by a component operation manager as described with reference to FIG. 7.

In some examples, an apparatus as described herein may perform a method or methods, such as the method 800. The apparatus may include features, means, or instructions (e.g., a non-transitory computer-readable medium storing instructions executable by a processor) for harvesting energy associated with a memory device using an inductor, routing current from the inductor to a component of the memory device, where the routed current is based on the energy harvested using the inductor, and operating the component of the memory device based on the routed current.

Some examples of the method 800 and the apparatus described herein may further include operations, features, means, or instructions for routing a second current to a second component of the memory device, where the second current passes through the inductor and the harvesting may be based on the second current passing through the inductor, decoupling the inductor from the second component of the memory device, and coupling the inductor with the component, where routing the current from the inductor to the component may be based on coupling the inductor with the component.

Some examples of the method 800 and the apparatus described herein may further include operations, features, means, or instructions for determining to increase an amount of power supplied to the component of the memory device, where routing the current from the inductor to the component may be based on the determining.

In some examples of the method 800 and the apparatus described herein, the inductor may be one of a set of inductors. Some examples of the method 800 and the apparatus described herein may further include operations, features, means, or instructions for routing a respective current to each component of a set of components of the memory device during a first time interval, where the respective current to each component passes through a respective inductor of the set of inductors, harvesting, using each inductor of the set of indicators, energy associated with the respective current during the first time interval, and routing current from at least one inductor of the set of inductors to a second respective component of the memory device during a second time interval, where the second time interval may be non-overlapping with the first time interval.

In some examples of the method 800 and the apparatus described herein, the component of the memory device may include a driver for an access line coupled with a memory cell, and the operations, features, means, or instructions for operating the component of the memory device may further include operations, features, means, or instructions for activating the access line using the driver and based on the routed current, and reading or writing the memory cell based on activating the access line.

In some examples of the method 800 and the apparatus described herein, the component of the memory device may include an access line coupled with a memory cell, and the operations, features, means, or instructions for operating the component of the memory device may further include operations, features, means, or instructions for writing a memory value to the memory cell via the access line and based on the routed current.

In some examples of the method 800 and the apparatus described herein, the memory cell may be charged based on the routed current. Some examples of the method 800 and the apparatus described herein may further include operations, features, means, or instructions for harvesting energy associated with the memory device using a second inductor, routing a second current from the second inductor to a second access line of the memory array that may be coupled with a second memory cell, where the second current may be based on the energy harvested using the second inductor and flows in a different direction than the routed current associated with the inductor, and writing a second memory value to a second memory cell based on the second current.

In some examples of the method 800 and the apparatus described herein, the memory value may be concurrently written to a first set of memory cells based on the energy harvested using the inductor, the first set of memory cells including the memory cell, and the second memory value may be concurrently written to a second set of memory cells based on the energy harvested using the second inductor, the second set of memory cells including the second memory cell.

Some examples of the method 800 and the apparatus described herein may further include operations, features, means, or instructions for harvesting energy associated with the memory device using a second inductor, where the inductor may be coupled with a first voltage reference and the second inductor may be coupled with a second voltage reference different from the first voltage reference, and routing a second current from the second inductor to the component of the memory array, where the second current may be based on the energy harvested using the second inductor, and where reading or writing the memory cell may be based on the second current.

Some examples of the method 800 and the apparatus described herein may further include operations, features, means, or instructions for routing a second current through a second inductor, where the inductor may be inductively coupled with the second inductor, and where the energy harvested using the inductor may be based on the second current through the second inductor.

Some examples of the method 800 and the apparatus described herein may further include operations, features, means, or instructions for reading a memory value from a first memory cell within the memory device, where a switching component routes a first current through the inductor based on reading the memory value, and where the energy harvested using the inductor may be based on the first current, decoupling, after the first current may be routed through the inductor, a first node of the inductor from the switching component and a second node of the inductor from a node having a first voltage, and coupling, after the decoupling, the second node of the inductor with the switching component and the first node of the inductor with a node having a second voltage, where routing the current from the inductor to the component is based on coupling the second node of the inductor with the switching component, and the operating includes writing the memory value to the first memory cell or to a second memory cell within the memory device.

Some examples of the method 800 and the apparatus described herein may further include operations, features, means, or instructions for routing a second current through a second inductor while the second node of the inductor may be coupled with the switching component, where the inductor may be inductively coupled with the second inductor.

Some examples of the method 800 and the apparatus described herein may further include operations, features, means, or instructions for reading a memory value from a memory cell within the memory device, where a switching component routes a first current through the inductor based on reading the memory value, and where the energy harvested using the inductor may be based on the first current, storing charge to a capacitor based on the first current being routed through the inductor, where the capacitor may be coupled with the inductor, and discharging the capacitor, where the operating includes writing the memory value to the memory cell or to a second memory cell within the memory device based on the discharging.

Some examples of the method 800 and the apparatus described herein may further include operations, features, means, or instructions for coupling a set of storage elements each within a respective memory cell of a set of memory cells with a respective sense component of a set of sense components, biasing a respective node of each of the set of sense components to a read reference voltage, developing, using a set of one or more sense components of the set of sense components, a common signal for one or more memory cells of the set of memory cells based on the read reference voltage, and determining, based on the common signal, that a memory value for each of the one or more memory cells may be included in a set of one or more memory values.

In some examples of the method 800 and the apparatus described herein, each of the set of sense components may be operable to couple an inductor with a voltage source associated with the read reference voltage based on the read reference voltage and a memory value for the respective memory cell, and the common signal may be developed and the energy may be harvested using the inductor based on the set of one or more sense components coupling the voltage source with the inductor.

Some examples of the method 800 and the apparatus described herein may further include operations, features, means, or instructions for biasing the respective node of each of the set of sense components to a second read reference voltage, where each of the set of sense components may be operable to couple the inductor with a voltage source associated with the second read reference voltage based on the second read reference voltage and the memory value for the respective memory cell, and reading a second memory value from at least a second subset of the set of memory cells or from a second set of memory cells based on a second set of one or more of the set of sense components coupling the inductor with the voltage source associated with the second read reference voltage.

Some examples of the method 800 and the apparatus described herein may further include operations, features, means, or instructions for biasing a respective input for each of set of multiplexing components to a first voltage, where the set of multiplexing components couple the set of sense components with the inductor based on the first voltage, biasing the respective node of each of the set of sense components to a second read reference voltage while the set of storage elements remain coupled with the set of sense components, where each of the set of sense components may be operable to couple the inductor with a voltage source associated with the second read reference voltage based on the second read reference voltage and the memory value for the respective memory cell, biasing the respective input for each of set of multiplexing components to a second voltage, where the set of multiplexing components couple the set of sense components with a second inductor based on the second voltage, and reading a second memory value from at least a second subset of the set of memory cells based on a second set of one or more of the set of sense components coupling the second inductor with the voltage source associated with the second read reference voltage.

Some examples of the method 800 and the apparatus described herein may further include operations, features, means, or instructions for coupling a set of storage elements each within a respective memory cell of a set of memory cells with a respective sense component of a set of sense components, and biasing a respective node of each of a set of sense components to a write reference voltage, where each of the plurality of sense components is operable to couple a node of the inductor with the respective memory cell based on a voltage of the node of the inductor and the write reference voltage, and the operating includes writing a memory value to at least a subset of the plurality of memory cells based on a set of one or more of the plurality of sense components coupling the node of the inductor with a set of one or more of the plurality of memory cells.

Some examples of the method 800 and the apparatus described herein may further include operations, features, means, or instructions for biasing the respective node of each of the set of sense components to a second write reference voltage, where each of the set of sense components may be operable to couple the node of the inductor with the respective memory cell based on the voltage of the node of the inductor and the second write reference voltage, and writing a second memory value to at least a second subset of the set of memory cells or to a second set of memory cells based on a second set of one or more of the set of switching components coupling the node of the inductor with a second set of one or more of the set of second access lines.

Some examples of the method 800 and the apparatus described herein may further include operations, features, means, or instructions for biasing a respective input for each of set of multiplexing components to a first voltage, where the set of multiplexing components couple the set of sense components with the node of the inductor based on the first voltage, biasing the respective node of each of the set of sense components to a second write reference voltage while the set of storage elements remain coupled with the set of sense components, where each of the set of sense components may be operable to couple the node of the inductor with the respective memory cell based on the voltage of the node of the inductor and the second write reference voltage, biasing the respective input for each of set of multiplexing components to a second voltage, where the set of multiplexing components couple the set of sense components with a second inductor based on the second voltage, and writing a second memory value to at least a second subset of the set of memory cells based on a second set of one or more of the set of sense components coupling the second inductor with the respective second access line.

Figure 9:
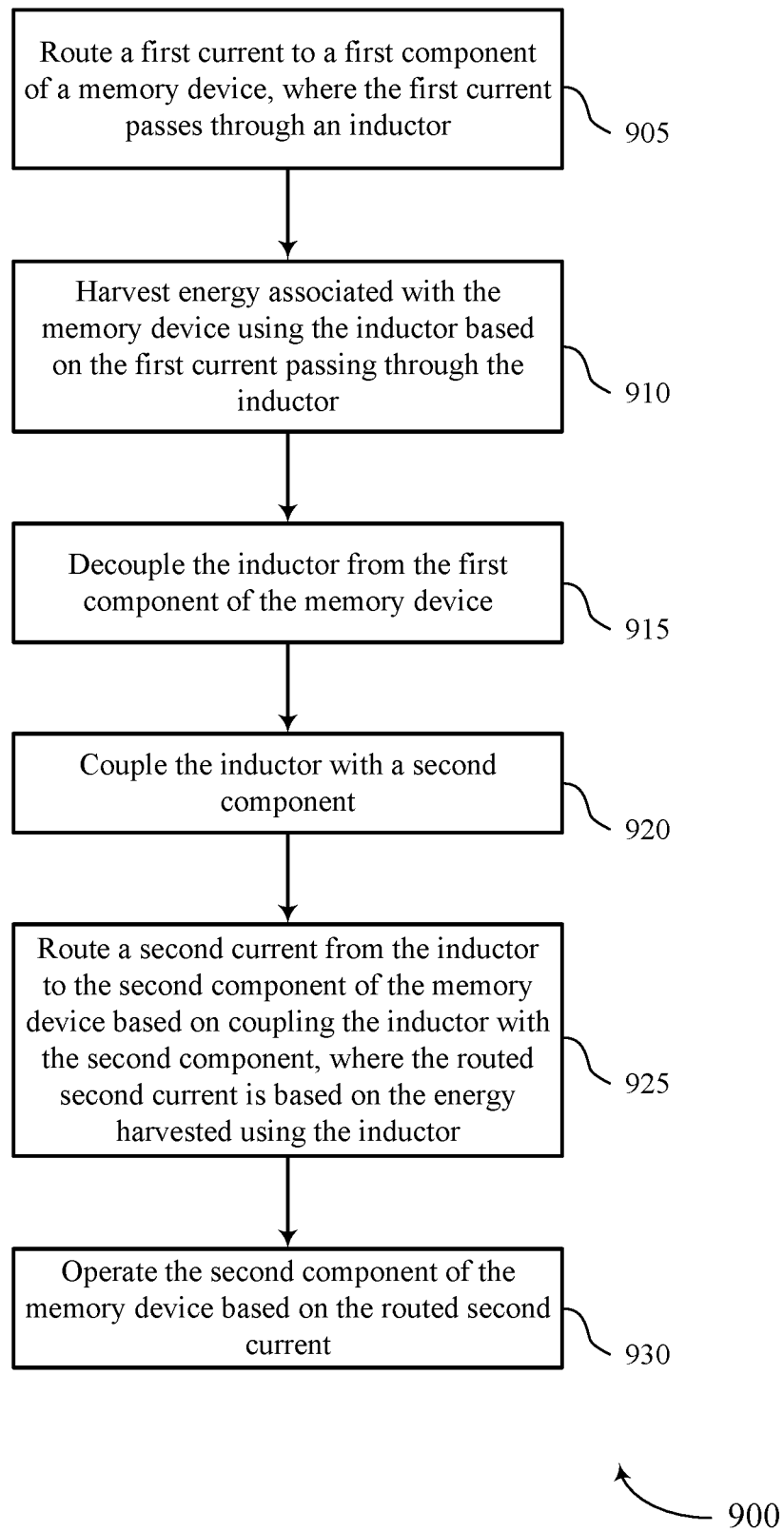

FIG. 9 shows a flowchart illustrating a method or methods 900 that supports inductive energy harvesting and signal development for a memory device in accordance with aspects of the present disclosure. The operations of method 900 may be implemented by a memory device or its components as described herein. For example, the operations of method 900 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 905, the memory device may route a first current to a first component of a memory device, where the first current passes through an inductor. The operations of 905 may be performed according to the methods described herein. In some examples, aspects of the operations of 905 may be performed by a current routing manager as described with reference to FIG. 7.

At 910, the memory device may harvest energy associated with the memory device using the inductor based on the first current passing through the inductor. The operations of 910 may be performed according to the methods described herein. In some examples, aspects of the operations of 910 may be performed by an energy harvesting manager as described with reference to FIG. 7.

At 915, the memory device may decouple the inductor from the second component of the memory device. The operations of 915 may be performed according to the methods described herein. In some examples, aspects of the operations of 915 may be performed by a coupling component as described with reference to FIG. 7.

At 920, the memory device may couple the inductor with a second component. The operations of 920 may be performed according to the methods described herein. In some examples, aspects of the operations of 920 may be performed by a coupling component as described with reference to FIG. 7.

At 925, the memory device may route a second current from the inductor to the second component of the memory device based on coupling the inductor with the second component, where the routed second current is based on the energy harvested using the inductor. The operations of 925 may be performed according to the methods described herein. In some examples, aspects of the operations of 925 may be performed by a current routing manager as described with reference to FIG. 7.

At 930, the memory device may operate the second component of the memory device based on the routed second current. The operations of 930 may be performed according to the methods described herein. In some examples, aspects of the operations of 930 may be performed by a component operation manager as described with reference to FIG. 7.

Figure 10:
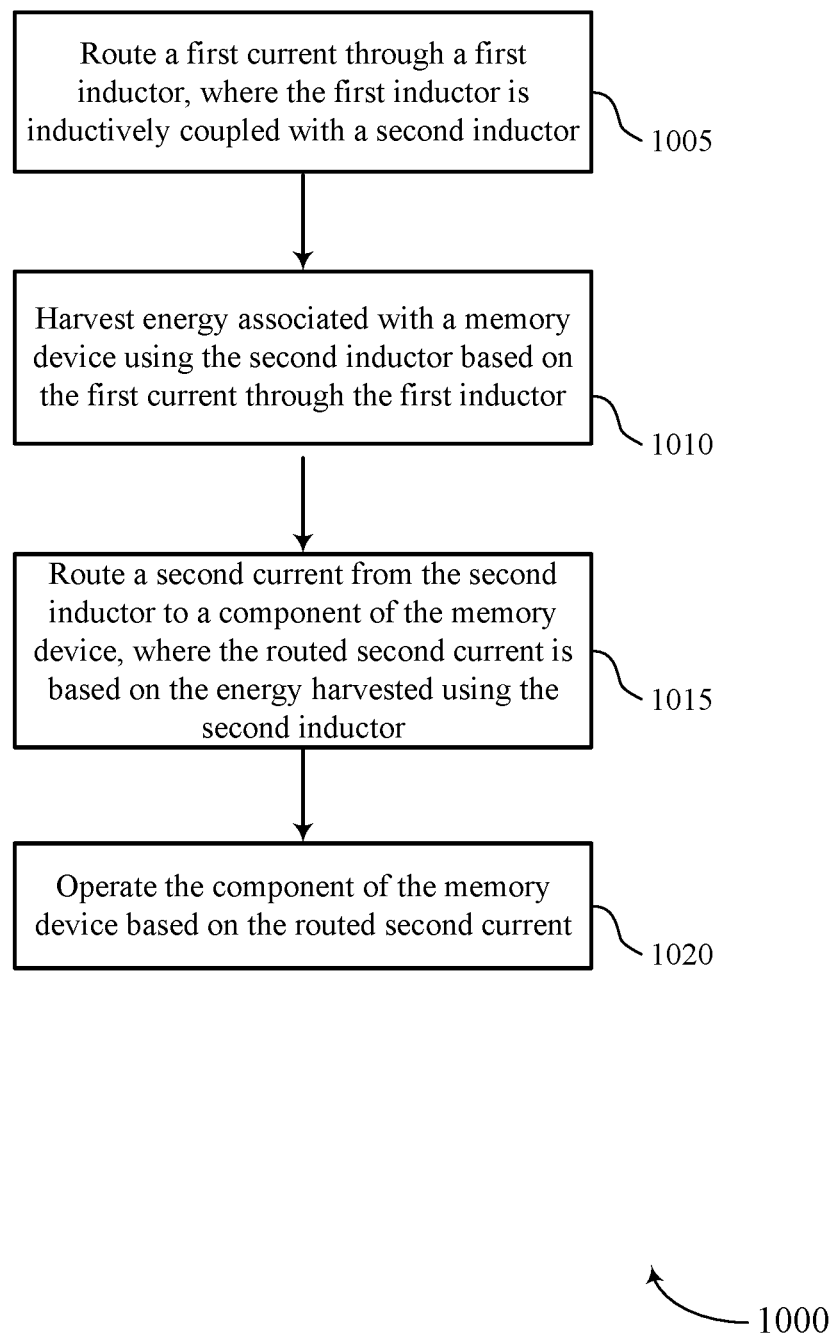

FIG. 10 shows a flowchart illustrating a method or methods 1000 that supports inductive energy harvesting and signal development for a memory device in accordance with aspects of the present disclosure. The operations of method 1000 may be implemented by a memory device or its components as described herein. For example, the operations of method 1000 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 1005, the memory device may route a first current through a first inductor, where the first inductor is inductively coupled with a second inductor. The operations of 1005 may be performed according to the methods described herein. In some examples, aspects of the operations of 1005 may be performed by a current routing manager as described with reference to FIG. 7.

At 1010, the memory device may harvest energy associated with a memory device using the second inductor based on the first current through the first inductor. The operations of 1010 may be performed according to the methods described herein. In some examples, aspects of the operations of 1010 may be performed by an energy harvesting manager as described with reference to FIG. 7.

At 1015, the memory device may route a second current from the second inductor to a component of the memory device, where the routed second current is based on the energy harvested using the second inductor. The operations of 1015 may be performed according to the methods described herein. In some examples, aspects of the operations of 1015 may be performed by a current routing manager as described with reference to FIG. 7.

At 1020, the memory device may operate the component of the memory device based on the routed second current. The operations of 1020 may be performed according to the methods described herein. In some examples, aspects of the operations of 1020 may be performed by a component operation manager as described with reference to FIG. 7.

Figure 11:
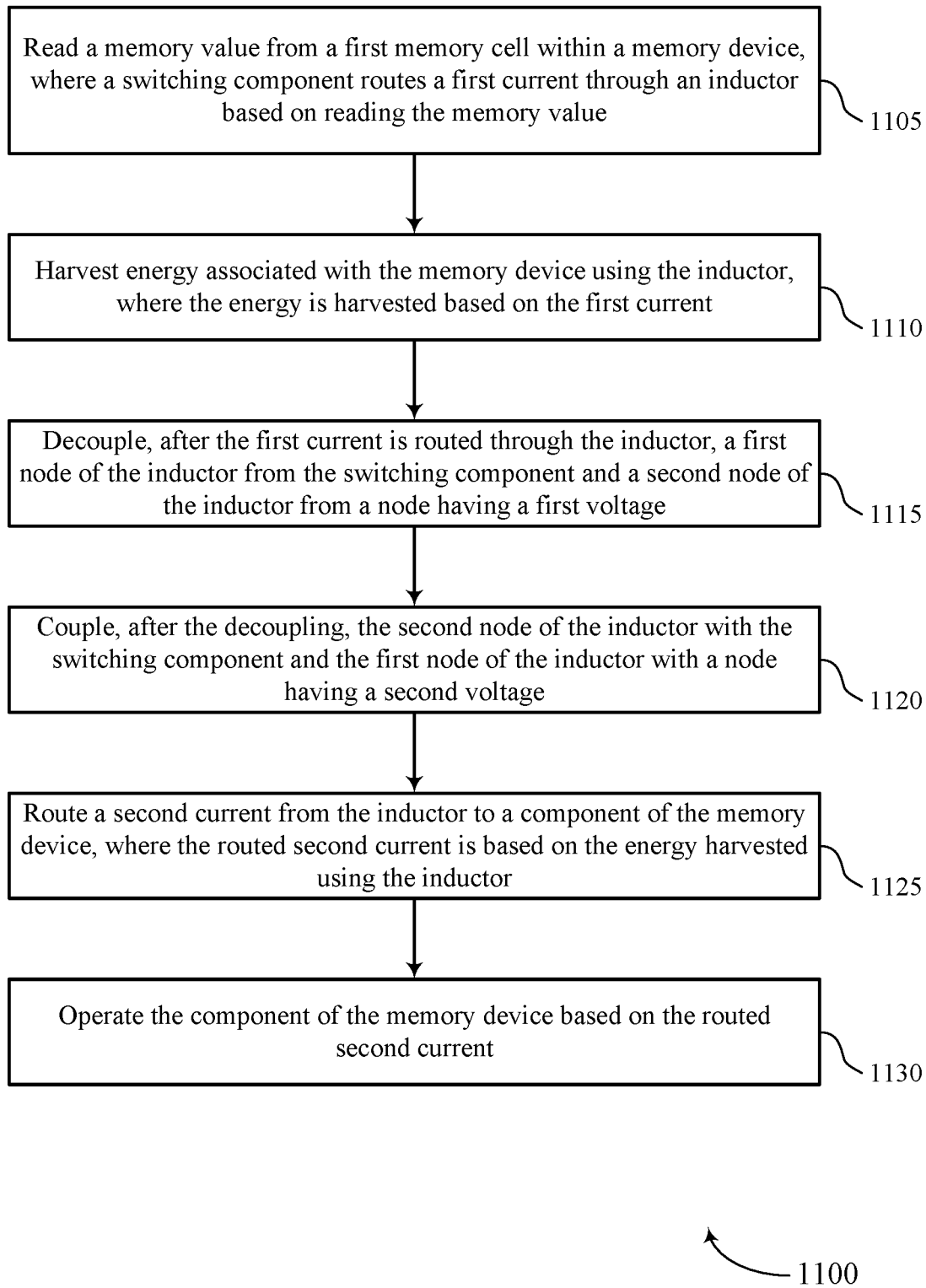

FIG. 11 shows a flowchart illustrating a method or methods 1100 that supports inductive energy harvesting and signal development for a memory device in accordance with aspects of the present disclosure. The operations of method 1100 may be implemented by a memory device or its components as described herein. For example, the operations of method 1100 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 1105, the memory device may read a memory value from a first memory cell within a memory device, where a switching component routes a first current through an inductor based on reading the memory value. The operations of 1105 may be performed according to the methods described herein. In some examples, aspects of the operations of 1105 may be performed by a memory value manager as described with reference to FIG. 7.

At 1110, the memory device may harvest energy associated with the memory device using the inductor, where the energy is harvested based on the first current. The operations of 1110 may be performed according to the methods described herein. In some examples, aspects of the operations of 1110 may be performed by an energy harvesting manager as described with reference to FIG. 7.

At 1115, the memory device may decouple, after the first current is routed through the inductor, a first node of the inductor from the switching component and a second node of the inductor from a node having a first voltage. The operations of 1115 may be performed according to the methods described herein. In some examples, aspects of the operations of 1115 may be performed by a coupling component as described with reference to FIG. 7.

At 1120, the memory device may couple, after the decoupling, the second node of the inductor with the switching component and the first node of the inductor with a node having a second voltage. The operations of 1120 may be performed according to the methods described herein. In some examples, aspects of the operations of 1120 may be performed by a coupling component as described with reference to FIG. 7.

At 1125, the memory device may route a second current from the inductor to a component of the memory device, where the routed second current is based on the energy harvested using the inductor. The operations of 1125 may be performed according to the methods described herein. In some examples, aspects of the operations of 1125 may be performed by a current routing manager as described with reference to FIG. 7.

At 1130, the memory device may operate the component of the memory device based on the routed second current. The operations of 1130 may be performed according to the methods described herein. In some examples, aspects of the operations of 1130 may be performed by a component operation manager as described with reference to FIG. 7.

Figure 12:
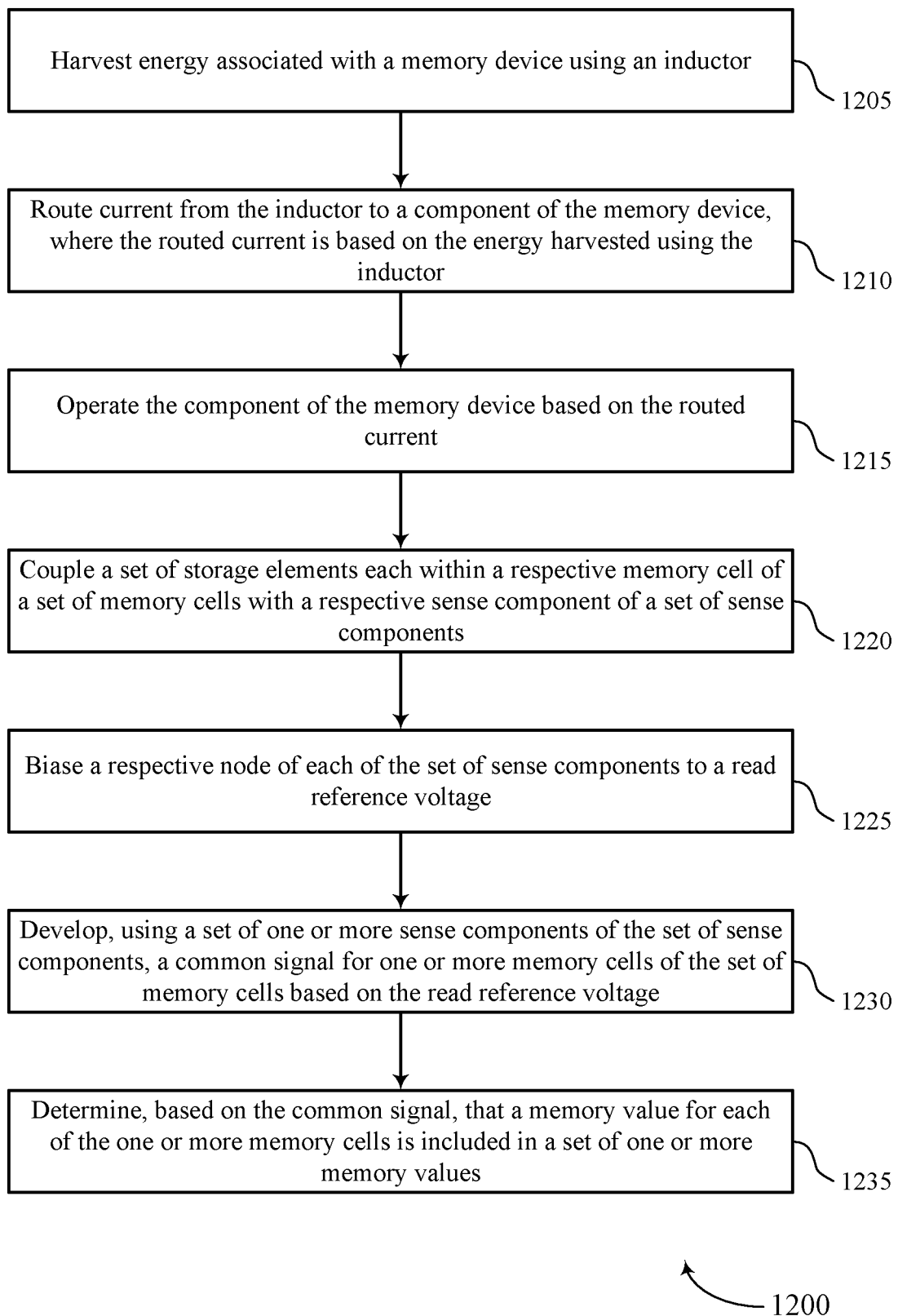

FIG. 12 shows a flowchart illustrating a method or methods 1200 that supports inductive energy harvesting and signal development for a memory device in accordance with aspects of the present disclosure. The operations of method 1200 may be implemented by a memory device or its components as described herein. For example, the operations of method 1200 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 1205, the memory device may harvest energy associated with a memory device using an inductor. The operations of 1205 may be performed according to the methods described herein. In some examples, aspects of the operations of 1205 may be performed by an energy harvesting manager as described with reference to FIG. 7.

At 1210, the memory device may route current from the inductor to a component of the memory device, where the routed current is based on the energy harvested using the inductor. The operations of 1210 may be performed according to the methods described herein. In some examples, aspects of the operations of 1210 may be performed by a current routing manager as described with reference to FIG. 7.

At 1215, the memory device may operate the component of the memory device based on the routed current. The operations of 1215 may be performed according to the methods described herein. In some examples, aspects of the operations of 1215 may be performed by a component operation manager as described with reference to FIG. 7.

At 1220, the memory device may couple a set of storage elements each within a respective memory cell of a set of memory cells with a respective sense component of a set of sense components. The operations of 1220 may be performed according to the methods described herein. In some examples, aspects of the operations of 1220 may be performed by a coupling component as described with reference to FIG. 7.

At 1225, the memory device may bias a respective node of each of the set of sense components to a read reference voltage. The operations of 1225 may be performed according to the methods described herein. In some examples, aspects of the operations of 1225 may be performed by a sensing manager as described with reference to FIG. 7.

At 1230, the memory device may develop, using a set of one or more sense components of the set of sense components, a common signal for one or more memory cells of the set of memory cells based on the read reference voltage. The operations of 1230 may be performed according to the methods described herein. In some examples, aspects of the operations of 1230 may be performed by a sensing manager as described with reference to FIG. 7.

At 1235, the memory device may determine, based on the common signal, that a memory value for each of the one or more memory cells is included in a set of one or more memory values. The operations of 1235 may be performed according to the methods described herein. In some examples, aspects of the operations of 1235 may be performed by a memory value manager as described with reference to FIG. 7.

Figure 13:
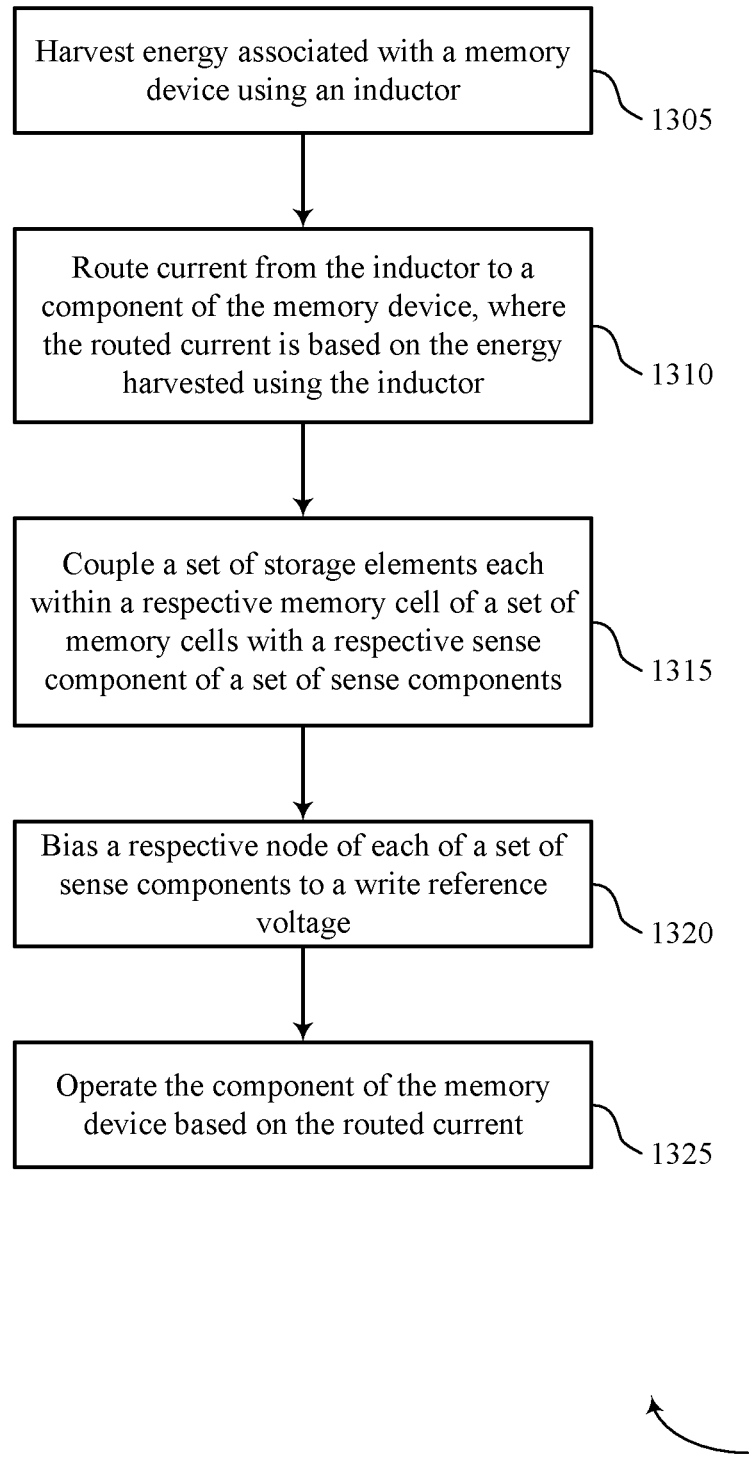

FIG. 13 shows a flowchart illustrating a method or methods 1300 that supports inductive energy harvesting and signal development for a memory device in accordance with aspects of the present disclosure. The operations of method 1300 may be implemented by a memory device or its components as described herein. For example, the operations of method 1300 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 1305, the memory device may harvest energy associated with a memory device using an inductor. The operations of 1305 may be performed according to the methods described herein. In some examples, aspects of the operations of 1305 may be performed by an energy harvesting manager as described with reference to FIG. 7.

At 1310, the memory device may route current from the inductor to a component of the memory device, where the routed current is based on the energy harvested using the inductor. The operations of 1310 may be performed according to the methods described herein. In some examples, aspects of the operations of 1310 may be performed by a current routing manager as described with reference to FIG. 7.

At 1315, the memory device may couple a set of storage elements each within a respective memory cell of a set of memory cells with a respective sense component of a set of sense components. The operations of 1315 may be performed according to the methods described herein. In some examples, aspects of the operations of 1315 may be performed by a coupling component as described with reference to FIG. 7.

At 1320, the memory device may bias a respective node of each of a set of sense components to a write reference voltage. The operations of 1320 may be performed according to the methods described herein. In some examples, aspects of the operations of 1320 may be performed by a sensing manager as described with reference to FIG. 7.

At 1325, the memory device may operate the component of the memory device based on the routed current. The operations of 1325 may be performed according to the methods described herein. In some examples, aspects of the operations of 1325 may be performed by a component operation manager as described with reference to FIG. 7.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include first array circuitry within a memory device and coupled with a switching component, second array circuitry within the memory device and coupled with the switching component, and an inductor coupled with the switching component, where the switching component is operable to couple the inductor with the first array circuitry while a first set of one or more memory cells coupled with the first array circuitry is being read or written, and couple the inductor with the second array circuitry while a second set of one or more memory cells coupled with the second array circuitry is being read or written.

Some examples of the apparatus may include a second inductor coupled with a second switching component, where the inductor may be coupled with a first voltage reference and the second inductor may be coupled with a second voltage reference different from the first voltage reference, and where the second switching component may be operable to couple the second inductor with the first array circuitry to read or write the first set of one or more memory cells coupled with the first array circuitry, and couple the second inductor with the second array circuitry to read or write the second set of one or more memory cells coupled with the second array circuitry.

Some examples of the apparatus may include a second switching component coupled with a node configured to may have a first voltage and with a node configured to may have a second voltage, and a flipping component coupled with the inductor, with the switching component, and with the second switching component, where the flipping component is operable to switch the inductor between a first configuration and a second configuration, where the first configuration includes a first node of the inductor being coupled with the switching component and a second node of the inductor being coupled with the second switching component, and the second configuration includes the second node of the inductor being coupled with the switching component and the first node of the inductor being coupled with the second switching component, and the second switching component may be operable to couple the second node of the inductor with the node configured to have the second voltage when the inductor is in the first configuration, and couple the second node of the inductor with the node configured to have the first voltage when the inductor is in the second configuration.

Some examples of the apparatus may include a second inductor that may be inductively coupled with the inductor and with a node configured to may have a third voltage, where the node configured to may have the third voltage may be operable to increase an amount of current through the inductor based on routing current through the second inductor.

Some examples of the apparatus may include a sense component, where a first node of the sense component is operable to be coupled with a digit line included in the first array circuitry, and wherein the sense component is operable to selectively bias a second node of the switching component to a voltage based on a read reference voltage and a voltage of the digit line, and a third node of the sense component is operable to be coupled with a word reference voltage, and wherein the sense component is operable to selectively couple the digit line with the inductor based on a voltage of a node of the inductor and the write reference voltage.

Some examples of the apparatus may include a second inductor, a multiplexing component coupled with the first inductor, the second inductor, the first transistor, and the second transistor, where the multiplexing component may be operable to receive a control signal, and the multiplexing component may be operable to couple a selected one of the inductor or the second inductor with the sense component, the selected one of the inductor or the second inductor based on a voltage of the control signal.

An apparatus is described. The apparatus may include first array circuitry within a memory device, where the first array circuitry includes a first set of one or more memory cells, an inductor couplable with the first array circuitry and with a first voltage reference, second array circuitry within the memory device, where the second array circuitry includes a second set of one or more memory cells, and a second inductor couplable with the second array circuitry and with a second voltage reference, where the second inductor is inductively coupled with the first inductor.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   first array circuitry within a memory device and coupled with a switching component,
   second array circuitry within the memory device and coupled with the switching component,
   a flipping component coupled with an inductor and the switching component, wherein the flipping component is operable to switch the inductor between a first configuration associated with a second voltage and a second configuration associated with a first voltage, and
   the inductor coupled with the switching component, wherein the switching component is operable to:
      couple the inductor with the first array circuitry while a first set of one or more memory cells coupled with the first array circuitry is being read or written; and
      couple the inductor with the second array circuitry while a second set of one or more memory cells coupled with the second array circuitry is being read or written.

2. The apparatus of claim 1, further comprising:
   a second inductor coupled with a second switching component, wherein the inductor is coupled with a first voltage reference and the second inductor is coupled with a second voltage reference different from the first voltage reference, and wherein the second switching component is operable to:
      couple the second inductor with the first array circuitry to read or write the first set of one or more memory cells coupled with the first array circuitry; and
      couple the second inductor with the second array circuitry to read or write the second set of one or more memory cells coupled with the second array circuitry.

3. The apparatus of claim 1, further comprising:
   a second switching component coupled with a node configured to have the first voltage and with a node configured to have the second voltage,
   the flipping component further coupled with the second switching component, wherein:
      the first configuration comprises a first node of the inductor being coupled with the switching component and a second node of the inductor being coupled with the second switching component; and
      the second configuration comprises the second node of the inductor being coupled with the switching component and the first node of the inductor being coupled with the second switching component; and
   the second switching component is operable to:
      couple the second node of the inductor with the node configured to have the second voltage when the inductor is in the first configuration; and
      couple the second node of the inductor with the node configured to have the first voltage when the inductor is in the second configuration.

4. The apparatus of claim 3, further comprising:
   a second inductor that is inductively coupled with the inductor and with a node configured to have a third voltage, wherein the node configured to have the third voltage is operable to increase an amount of current through the inductor based at least in part on routing current through the second inductor.

5. The apparatus of claim 3, wherein the inductor is operable to:
   transfer at least a portion of a charge stored in one or more memory cells of the first set or the second set to a capacitive plate of the switching component as part of a read operation based at least in part on the inductor being in the first configuration; and transfer at least the portion of the charge to the one or more memory cells as part of a write-back operation based at least in part on the inductor being in the second configuration.

6. The apparatus of claim 1, further comprising:
one or more sense amplifiers selectively coupled with one or more memory cells of the first set or the second set, wherein the one or more sense amplifiers are configured to:
pass a charge to the inductor from a memory cell of the one or more memory cells based at least in part on a value stored at the memory cell matching a reference value.

7. The apparatus of claim 1, wherein the memory device comprises:
a first memory die that comprises the first array circuitry and the second array circuitry, and
a second memory die that comprises the inductor.

8. The apparatus of claim 1, wherein:
the memory device is mounted to a circuit board, and
the inductor is located outside the memory device and is mounted to the circuit board.

9. An apparatus, comprising:
first array circuitry within a memory device and coupled with a switching component;
second array circuitry within the memory device and coupled with the switching component; and
an inductor coupled with the switching component, wherein the switching component is operable to:
couple the inductor with the first array circuitry while a first set of one or more memory cells coupled with the first array circuitry is being read or written; and
couple the inductor with the second array circuitry while a second set of one or more memory cells coupled with the second array circuitry is being read or written, and
a sense component, wherein:
a first node of the sense component is operable to be coupled with a digit line included in the first array circuitry, and wherein the sense component is operable to selectively bias a node of the switching component to a voltage based at least in part on a read reference voltage and a voltage of the digit line; and
a second node of the sense component is operable to be coupled with a write reference voltage, and wherein the sense component is operable to selectively couple the digit line with the inductor based at least in part on a voltage of a node of the inductor and the write reference voltage.

10. The apparatus of claim 9, further comprising:
a second inductor; and
a multiplexing component coupled with the inductor, the second inductor, a first transistor, and a second transistor, wherein:
the multiplexing component is operable to receive a control signal; and
the multiplexing component is operable to couple a selected one of the inductor or the second inductor with the sense component, the selected one of the inductor or the second inductor based at least in part on a voltage of the control signal.

11. An apparatus, comprising:
first array circuitry within a memory device and coupled with a switching component;
second array circuitry within the memory device and coupled with the switching component; and
an inductor coupled with the switching component, wherein the switching component is coupled with a first node that is coupled with a first voltage source with a first voltage level, and with a second node with a second voltage source with a second voltage level different from the first voltage level, wherein the switching component is operable to:
couple the inductor with the first array circuitry while a first set of one or more memory cells coupled with the first array circuitry is being read or written;
couple the inductor with the second array circuitry while a second set of one or more memory cells coupled with the second array circuitry is being read or written;
couple the inductor with the first node to pull charge through the inductor based at least in part on the first voltage level; and
couple the inductor with the second node to push charge through the inductor based at least in part on the second voltage level.

12. An apparatus, comprising:
first array circuitry within a memory device and coupled with a switching component;
second array circuitry within the memory device and coupled with the switching component; and
an inductor coupled with the switching component, wherein the switching component is operable to:
couple the inductor with the first array circuitry while a first set of one or more memory cells coupled with the first array circuitry is being read or written;
couple the inductor with the second array circuitry while a second set of one or more memory cells coupled with the second array circuitry is being read or written; and
transfer, as part of a first access operation associated with the first array circuitry or the second array circuitry, charge from a capacitive plate of the switching component that was deposited on the capacitive plate via the inductor as part of a second access operation associated with the first array circuitry or the second array circuitry.

13. A method, comprising:
coupling, using a switching component that is coupled with an inductor and with first array circuitry within a memory device, the inductor with the first array circuitry while a first set of one or more memory cells coupled with the first array circuitry is being read or written;
coupling, using the switching component that is coupled with second array circuitry within the memory device, the inductor with the second array circuitry while a second set of one or more memory cells coupled with the second array circuitry is being read or written and
switching, using a flipping component coupled with the inductor and the switching component, the inductor between a first configuration associated with a second voltage and a second configuration associated with a first voltage.

14. The method of claim 13, further comprising:
coupling, using a second switching component that is coupled with a second inductor, the second inductor with the first array circuitry to read or write the first set of one or more memory cells coupled with the first array circuitry; and coupling, using the second switching component, the second inductor with the second array circuitry to read or write the second set of one or more memory cells coupled with the second array circuitry, wherein the inductor is coupled with a first voltage reference and the second inductor is coupled with a second voltage reference different from the first voltage reference.

15. The method of claim 13, wherein
the flipping component is further coupled with a second switching component, the first configuration comprising a first node of the inductor being coupled with the switching component and a second node of the inductor being coupled with the second switching component, the second configuration comprising the second node of the inductor being coupled with the switching component and the first node of the inductor being coupled with the second switching component, wherein the second switching component is coupled with a node configured to have the first voltage and with a node configured to have the second voltage.

16. The method of claim 15, further comprising:
coupling, using the second switching component, the second node of the inductor with the node configured to have the second voltage when the inductor is in the first configuration.

17. The method of claim 15, further comprising:
coupling, using the second switching component, the second node of the inductor with the node configured to have the first voltage when the inductor is in the second configuration.

18. A method comprising:
coupling, using a switching component that is coupled with an inductor and with first array circuitry within a memory device, the inductor with the first array circuitry while a first set of one or more memory cells coupled with the first array circuitry is being read or written;
coupling, using the switching component that is coupled with second array circuitry within the memory device, the inductor with the second array circuitry while a second set of one or more memory cells coupled with the second array circuitry is being read or written; and
routing current through a second inductor that is inductively coupled with the inductor and with a node configured to have a third voltage, wherein an amount of current through the inductor is increased based at least in part on routing current through the second inductor.

19. A method, comprising:
coupling, using a switching component that is coupled with an inductor and with first array circuitry within a memory device, the inductor with the first array circuitry while a first set of one or more memory cells coupled with the first array circuitry is being read or written;
coupling, using the switching component that is coupled with second array circuitry within the memory device, the inductor with the second array circuitry while a second set of one or more memory cells coupled with the second array circuitry is being read or written;
coupling a first node of a sense component with a digit line included in the first array circuitry;
biasing, using the sense component, a node of the switching component to a voltage based at least in part on a read reference voltage and a voltage of the digit line;
coupling a second node of the sense component with a write reference voltage; and
selectively coupling, using the sense component, the digit line with the inductor based at least in part on a voltage of a node of the inductor and the write reference voltage.

20. The method of claim 19, further comprising:
receiving a control signal at a multiplexing component coupled with the inductor, a second inductor, a first transistor, and a second transistor; and
coupling, using the multiplexing component, a selected one of the inductor or the second inductor with the sense component, the selected one of the inductor or the second inductor based at least in part on the voltage of the control signal.

* * * * *